(12) United States Patent
Jeong et al.

(10) Patent No.: US 6,486,514 B2
(45) Date of Patent: Nov. 26, 2002

(54) WIRING LINE ASSEMBLY FOR THIN FILM TRANSISTOR ARRAY SUBSTRATE AND A METHOD FOR FABRICATING THE SAME

(75) Inventors: Chang-Oh Jeong, Incheon (KR); Jae-Gab Lee, Seoul (KR); Beom-Seok Cho, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/917,689

(22) Filed: Jul. 31, 2001

(65) Prior Publication Data

US 2002/0033484 A1 Mar. 21, 2002

(30) Foreign Application Priority Data

Jul. 31, 2000 (KR) ........................................ 2000-44417

(51) Int. Cl.[7] .......................... H01L 27/01; H01L 27/12; H01L 31/0392; H01L 23/48; H01L 23/52
(52) U.S. Cl. ........................... 257/350; 257/59; 257/72; 257/741; 257/762
(58) Field of Search ........................... 257/59, 72, 350, 257/741, 762

(56) References Cited

U.S. PATENT DOCUMENTS 6,081,310 A * 6/2000 Katsuya et al. ............. 349/113
6,175,345 B1 * 1/2001 Kuribayashi et al. ......... 345/76
6,313,571 B1 * 11/2001 Hasegawa et al. .......... 313/309

* cited by examiner

*Primary Examiner*—Ngân V. Ngô
(74) *Attorney, Agent, or Firm*—McGuire Woods LLP; Hae-Chan Park

(57) ABSTRACT

According to one aspect of the present invention, the thin film transistor array substrate basically includes a gate line assembly based on an Ag alloy. The Ag alloy comprises Ag and at least one of alloy elements and the alloy elements each bearing a low melting point. The gate line assembly comprises a gate electrode and a gate line. A data line assembly crosses over the gate line assembly while being insulated from the gate line assembly. The data line assembly comprises a source electrode, a drain electrode and a data line. A semiconductor layer contacts the source electrode and the drain electrode. The semiconductor layer forms a thin film transistor together with the gate electrode, the source electrode and the drain electrode. A pixel electrode is connected to the drain electrode.

19 Claims, 32 Drawing Sheets

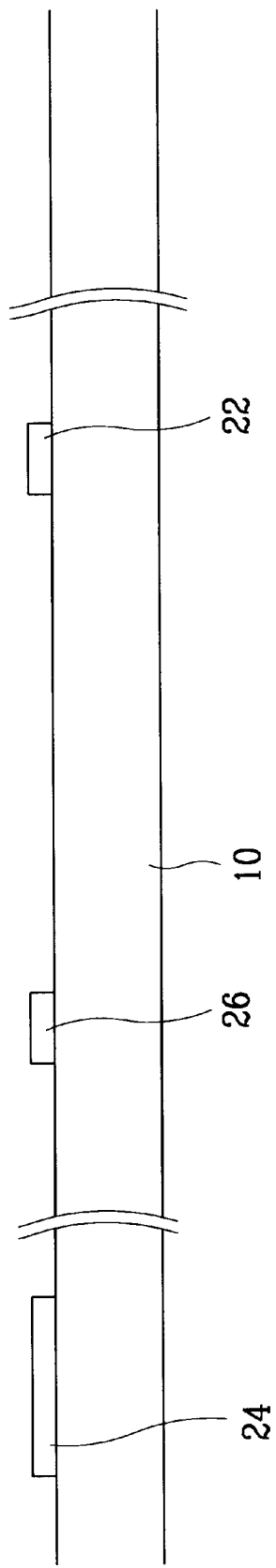

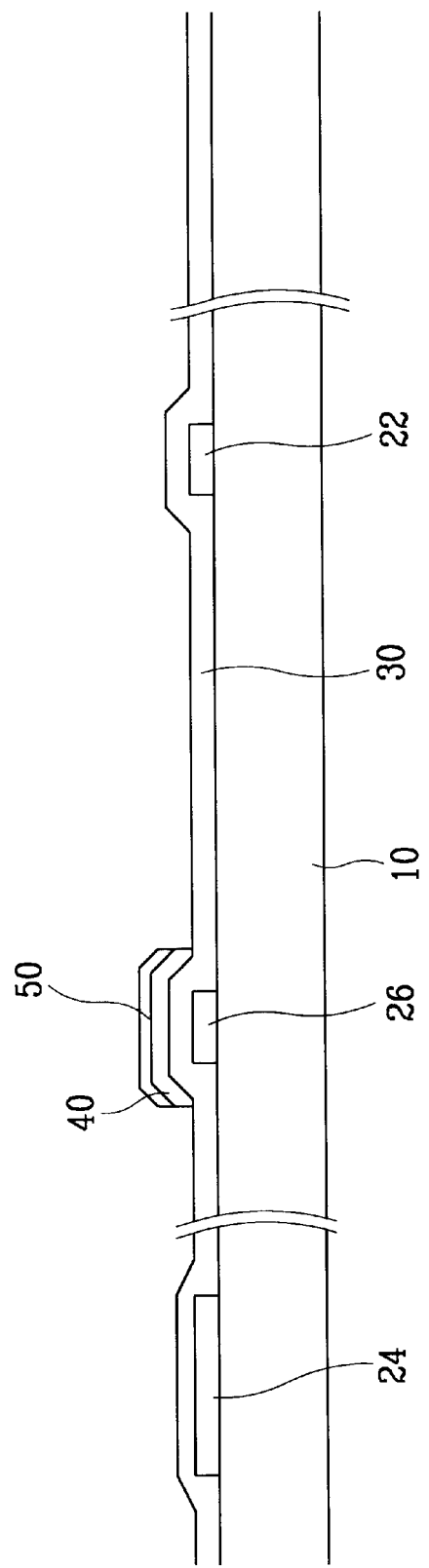

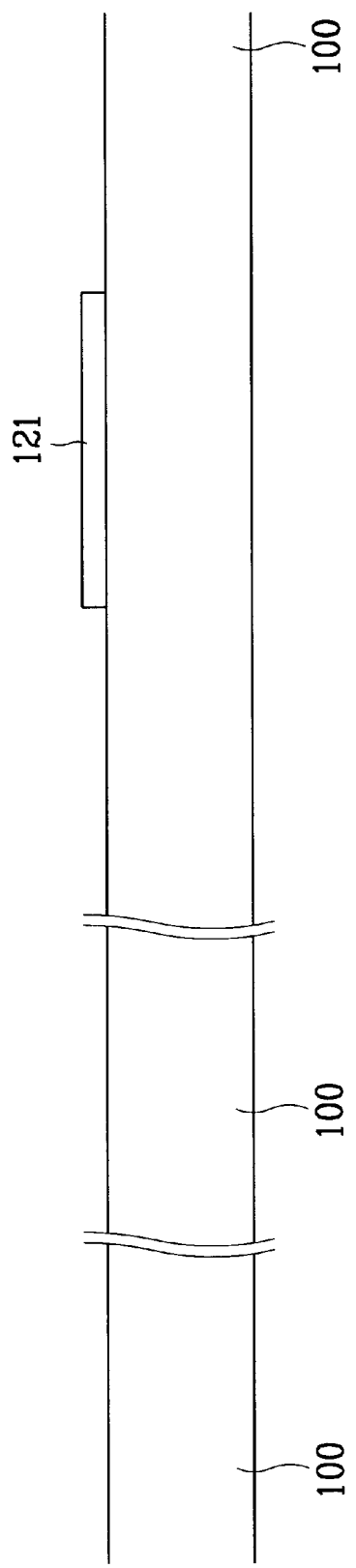

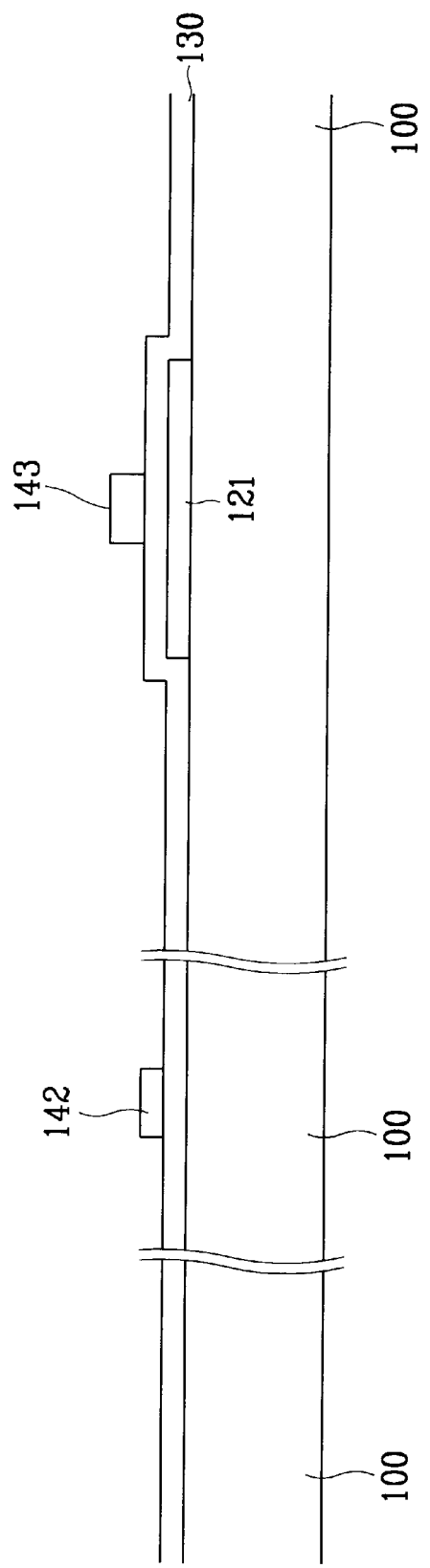

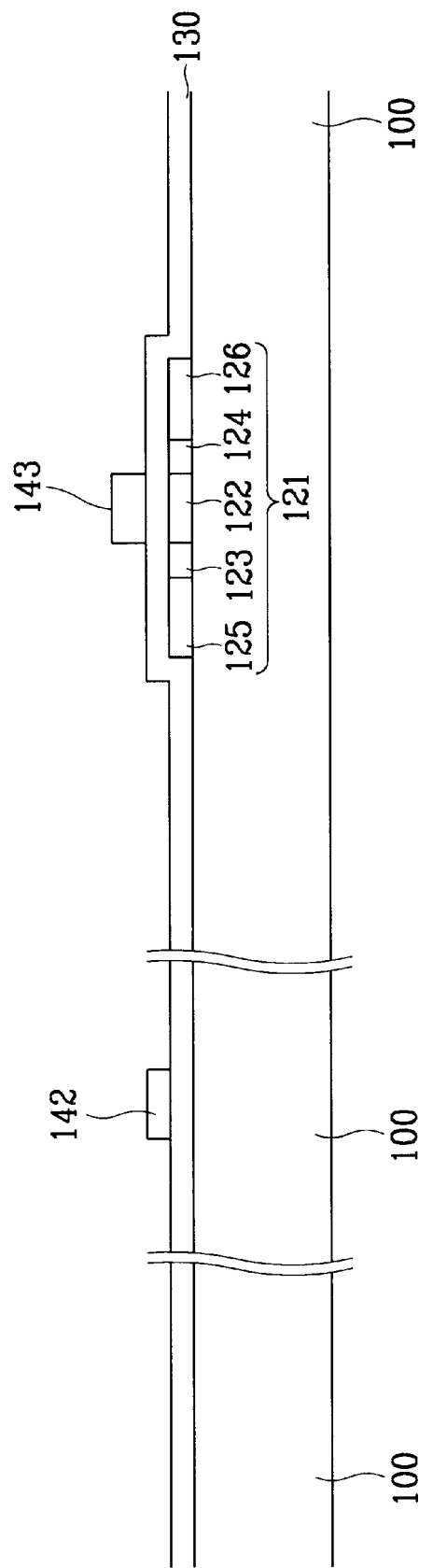

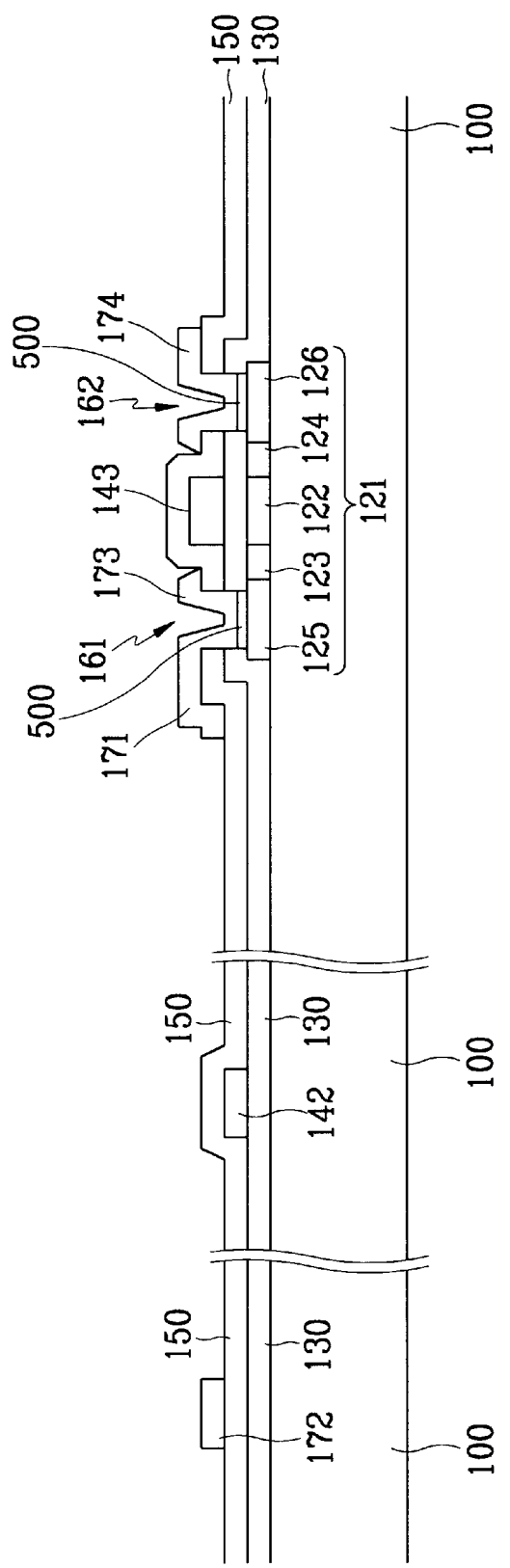

WIRING LINE ASSEMBLY FOR THIN FILM TRANSISTOR ARRAY SUBSTRATE AND A METHOD FOR FABRICATING THE SAME

BACKGROUND OF THE INVENTION (a) Field of the Invention

The present invention relates to a wiring line assembly and a method for fabricating the same and, more particularly, to a wiring line assembly used for a thin film transistor array substrate for a liquid crystal display.

(b) Description of the Related Art

Generally, wiring lines for a semiconductor device or a display device are used for signal transmission, and hence, it becomes important lines to keep such wiring away from signal delays as much as possible.

Particularly, as a large-size high-resolution liquid crystal display develops, it becomes more important that the thin film transistor array substrate for such a liquid crystal display should involve low resistance wiring lines to minimize the signal delay. For instance, a low resistance metal such as Al or Al alloy may be used for the wiring purpose.

However, the Al or Al alloy-based wiring lines bear a weak physical or chemical characteristic. The Al or Al alloy erodes easily at the contacting area, when contacting other conductive materials.

SUMMARY OF THE INVENTION

It is an object of the present invention to provide a thin film transistor array substrate that has a wiring line assembly bearing low resistance and good adhesion characteristics.

This and other objects may be achieved by a thin film transistor array substrate having a wiring line assembly with the following features.

The wiring line assembly is formed with an Ag alloy. The Ag alloy comprises Ag and at least one of alloy elements. Each of the alloy elements bears a low melting point.

Each of the alloy elements each bear a diffusion coefficient of 1.5E-12 $cm^2$/sec or more. The alloy elements each bear a melting point of 1500K or less. The wiring line assembly is formed with an Ag alloy comprising Ag and at least one of alloy elements and the alloy elements each bearing a low melting point. The composition content ratio of the alloy elements to the Ag alloy is 20at% or less. The alloy elements are selected from the group consisting of Li, Mg, Al, Sm, and Mn. The Ag alloy is used for reflection electrodes for a reflection type liquid crystal display.

According to one aspect of the present invention, the thin film transistor array substrate basically includes a gate line assembly based on an Ag alloy. The Ag alloy comprises Ag and at least one of alloy elements and the alloy elements each bear a low melting point. The gate line assembly comprises a gate electrode and a gate line. A data line assembly crosses over the gate line assembly while being insulated from the gate line assembly. The data line assembly comprises a source electrode, a drain electrode and a data line. A semiconductor layer contacts the source electrode and the drain electrode. The semiconductor layer forms a thin film transistor together with the gate electrode, the source electrode and the drain electrode. A pixel electrode is connected to the drain electrode.

Herein the data line assembly may be based on an Ag alloy. The Ag alloy for the data line assembly comprises Ag and at least one of alloy elements and the alloy elements each bear a low melting point. The alloy elements each bear a diffusion coefficient of 1.5E-12 $cm^2$/sec or more. The alloy elements each bear a melting point of 1500K or less. The composition content ratio of the alloy elements to the Ag alloy is 20at% or less. The alloy elements may be selected from the group consisting of Li, Mg, Al, Sm, and Mn.

Herein, the thin film transistor array substrate further comprises an insulating substrate under the gate line assembly, a gate insulating layer covering the gate line assembly and being under the semiconductor layer, and a protective layer covering the data line assembly with a contact hole exposing the drain electrode. The drain electrode is placed on the semiconductor layer together with the source electrode and the pixel electrode is connected to the drain electrode through the contact hole. The semiconductor layer is formed of hydrogenated amorphous silicon.

Herein, the thin film transistor array substrate further comprises an alloy element-oxide layer. The alloy element-oxide layer being interposed between the source electrode and the semiconductor layer and between the drain electrode and the semiconductor layer.

And, the thin film transistor array substrate further comprises an insulating substrate under the semiconductor layer having a source region, a drain region and a channel region, a gate insulating layer covering the semiconductor layer and being under the gate line assembly, an inter-layered insulating layer covering the gate line assembly in which the inter-layered insulating layer and the gate insulating layer have contact holes exposing the source region and the drain region and the source and the drain electrodes are connected to the source and the drain regions through the contact holes, and a protective layer covering the data line assembly with a contact hole exposing the drain electrode in which the pixel electrode is connected to the drain electrode through the contact hole of the protective layer. The semiconductor layer is formed with poly-crystalline silicon.

The thin film transistor array substrate further comprises an alloy element-oxide layer. The alloy element-oxide layer is interposed between the source electrode and the semiconductor layer and between the drain electrode and the semiconductor layer.

In a method for fabricating the thin film transistor array substrate, a gate line assembly is formed on an insulating substrate with an Ag alloy. The Ag alloy comprises Ag and at least one of alloy elements and the alloy elements each bearing a low melting point. The gate line assembly comprises a gate electrode and a gate line. A gate insulating layer is formed on the substrate such that the gate insulating layer covers the gate line assembly. A semiconductor layer is formed on the gate insulating layer. A data line assembly is formed on the semiconductor layer. The data line assembly comprises a source electrode, a drain electrode and a data line. A protective layer is formed on the substrate such that the protective layer covers the data line assembly. A contact hole exposing the drain electrode is formed in the protective layer. A pixel electrode is formed on the protective layer such that the pixel electrode is connected to the drain electrode through the contact hole.

Herein, The data line assembly is formed with an Ag alloy. The Ag alloy comprises Ag and at least one of alloy elements each bearing a low melting point. The gate line assembly is formed through depositing an Ag alloy layer onto the substrate through sputtering a target of the Ag alloy with an oxygen concentration of 5000 ppm or less. The Ag alloy layer is patterned through a photolithography. The protective layer is formed through heat treatment at 200° C.

or more. The alloy element of the Ag alloy layer for the data line assembly reacts with a silicon oxide layer to form an alloy element-oxide layer during the process of heat treatment for forming the protective layer where the silicon oxide layer is naturally formed on the semiconductor layer.

Also, in a method for fabricating the thin film transistor array substrate, a semiconductor layer is formed on an insulating substrate. A gate insulating layer is formed on the substrate such that the gate insulating layer covers the semiconductor layer. A gate line assembly is formed on the gate insulating layer with an Ag alloy. The Ag alloy comprises Ag and at least one of alloy elements and the alloy elements each bear a low melting point. The gate line assembly comprises a gate electrode and a gate line. A source and a drain region are formed through doping the semiconductor layer with impurities and while defining a channel region. An inter-layered insulating layer is formed on the substrate such that the inter-layered insulating layer covers the gate line assembly. Contact holes exposing the source and the drain regions are formed in the inter-layered insulating layer and the gate insulating layer. A data line assembly is formed on the inter-layered insulating layer. The data line assembly comprises a source electrode connected to the source region, a drain electrode connected to the drain region, and a data line. A protective layer is formed on the substrate such that the protective layer covers the data line assembly. A contact hole exposing the drain electrode is formed in the protective layer. A pixel electrode is formed on the protective layer such that the pixel electrode is connected to the drain electrode through the contact hole.

Herein, the data line assembly may be formed with an Ag alloy. The Ag alloy for the data line assembly comprises Ag and at least one of alloy elements and the alloy elements each bear a low melting point. The gate line assembly is formed through depositing an Ag alloy layer onto the substrate through sputtering a target of the Ag alloy with an oxygen concentration of 5000 ppm or less. The Ag alloy layer is patterned through photolithography.

The protective layer is formed through heat treatment at 200° C. or more. The alloy element of the Ag alloy layer for the data line assembly reacts with a silicon oxide layer to form an alloy element-oxide layer during the process of heat treatment for forming the protective layer where the silicon oxide layer is naturally formed on the semiconductor layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIG. 11B is a cross sectional view of the thin film transistor array substrate taken along the XIb–XIb' line of FIG. 11A;

FIG. 12B is a cross sectional view of the thin film transistor array substrate taken along the XIIb–XIIb' line of FIG. 12A;

FIG. 18B is a cross sectional view of the thin film transistor array substrate taken along the XVIIIb–XVIIIb' line of FIG. 18A;

FIG. 19B is a cross sectional view of the thin film transistor array substrate taken along the XIXb–XIXb' line of FIG. 19A;

FIG. 20B is a cross sectional view of the thin film transistor array substrate taken along the XXb–XXb' line of FIG. 20A;

FIG. 21B is a cross sectional view of the thin film transistor array substrate taken along the XXIb–XXIb' line of FIG. 21A;

DETAILED DESCRIPTION OF THE PREFERRED EMBODIMENTS

Preferred embodiments of this invention will be explained with reference to the accompanying drawings.

In a large-size high resolution liquid crystal display, it is essential to develop a low resistance metal-based wiring line assembly. For this reason, silver (Ag) bearing a lowest resistance among metal has been studied to use for the wiring line assembly.

However, in order to use Ag for the wiring line assembly, suitable processing conditions should have been first developed, considering the material aspects of Ag.

Pure silver exhibits poor adhesion characteristic with respect to glass. And its material characteristics is easily deteriorated under $H_2SO_4$, NaCl, or KOH. In order to solve such a problem, alloy elements may be added to Ag.

Figure 1:
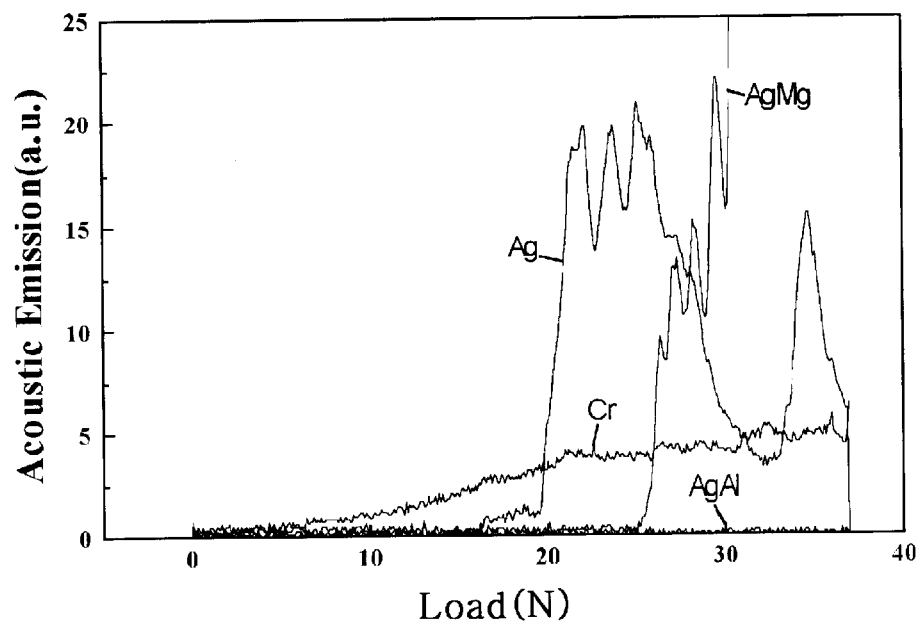
FIG. 1 is a graph illustrating the adhesion test results for Ag, AgAl, AgMg and Cr.

FIG. 1 is a graph illustrating the adhesion test results with respect to Ag, AgAl, AgMg and Cr. A thin film having a thickness of 1 $\mu$m is deposited onto a glass substrate through sputtering, and scratched by a scratch tester to measure the adhesion.

In measuring by the scratch tester, a sample is arranged to be inclined by a predetermined angle, and scratched with a diamond tip to measure acoustic emission thereof. When the sampled thin film is broken up, the waveform of the acoustic emission reaches a peak. At this time, the load functioning as a critical load represents the adhesive value between the thin film and the substrate.

It can be known from the graph that the critical load of Ag is about 20N, and that of AgMg is 25N. Furthermore, AgAl and Cr exhibit no peak at the load of 35N or less. It turns out that under the application of Ag alloy to the wiring line assembly, the adhesion thereof with respect to the underlying substrate can be significantly enhanced.

Table 1 indicates variation in the resistivity pursuant to the annealing of Ag, AgAl, and AgMg.

AgMg exhibits a resistivity close to that of Ag. In the case of AgAl, the resistivity thereof is high because it contains much of the Al content and hence, can be sufficiently reduced through lowering the Al content.

TABLE 1

| Temperature | Ag | AgMg (Mg: 1 at %) | AgAl (Al: 5 at %) |
|---|---|---|---|
| As-dep | 1.8732 | 2.284 | 7.54125 |
| 200° C. | 1.7136 | 2.08 | 7.356 |
| 300° C. | 1.5624 | 1.9184 | 7.146 |
| 400° C. | 1.666 | 1.9472 | 6.279 |
| 500° C. | 1.666 | 1.8784 | 6.381 |
| 600° C. | 1.666 | 1.7344 | 6.426 |
| 700° C. | 11.3008 | 1.948 | 7.5 |

When an Ag alloy with alloy content such as Mg and Al at a suitable proportion is used for the wiring line assembly, the adhesion characteristic thereof with respect to the underlying substrate is improved while the resistivity thereof being close to Ag.

FIGS. 2, 3, 4 and 5 illustrate the auger electron spectroscopy (AES) analysis data with respect to the layered structure of an Ag alloy-based layer, a silicon oxide layer, and a silicon layer after and before the annealing.

Figure 2:
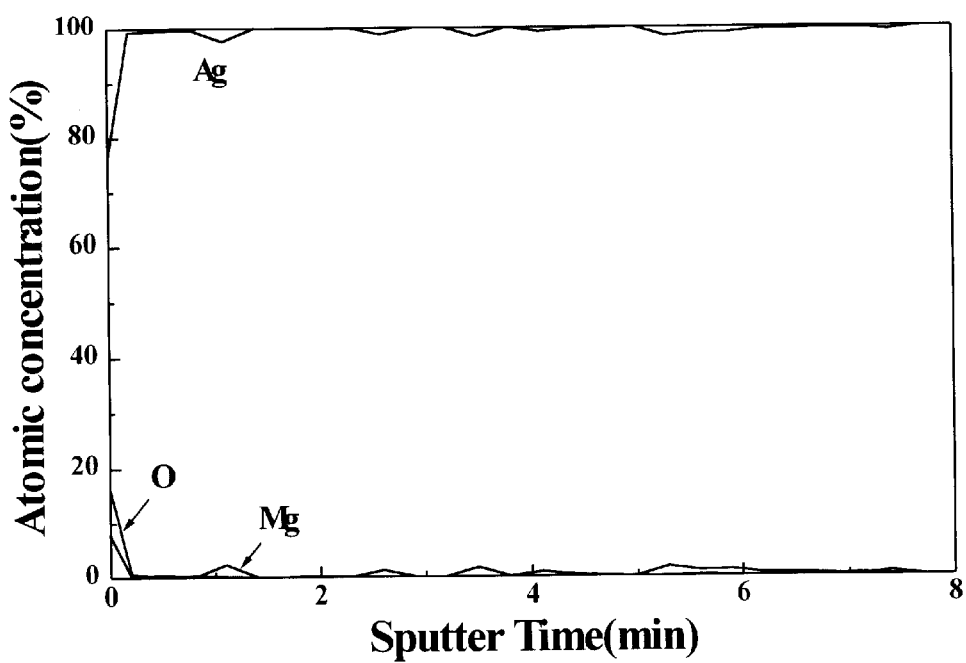
FIG. 2 is a graph illustrating the AES analysis results for a sample of an AgMg-based layer under deposition.
Figure 3:
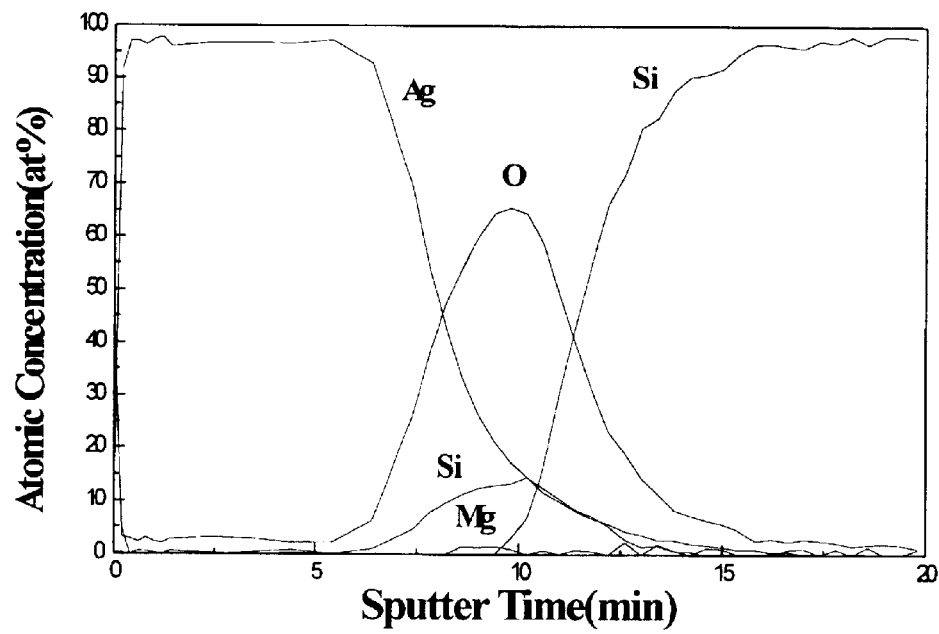
FIG. 3 is a graph illustrating the AES analysis results for a sample of an AgMg-based layer where heat-treatment is made at 400° C. under a vacuum atmosphere.
Figure 4:
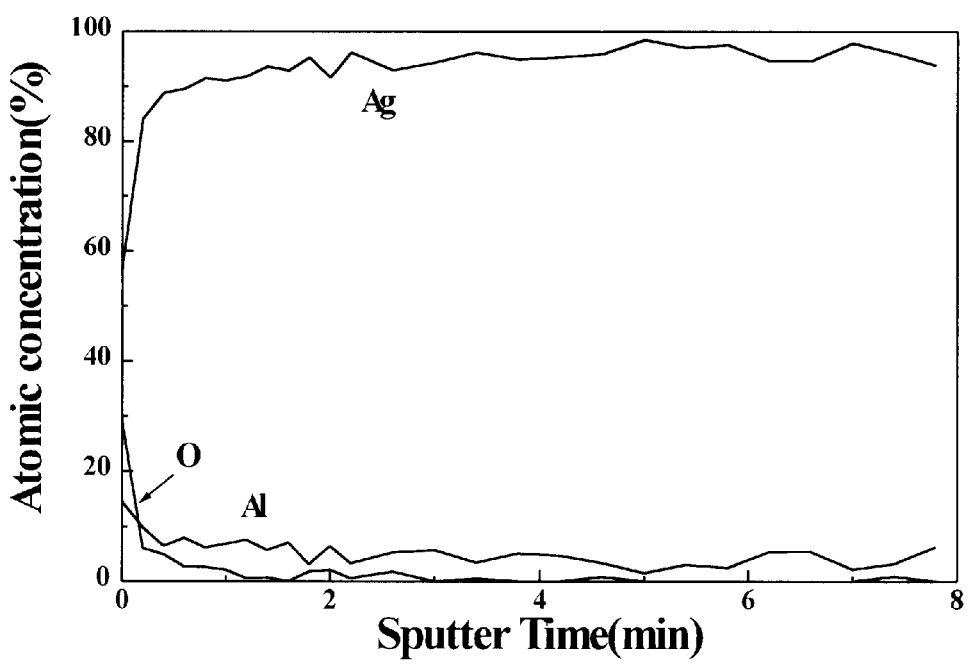
FIG. 4 is a graph illustrating the AES analysis results for a sample of an AgAl-based layer line under deposition.
Figure 5:
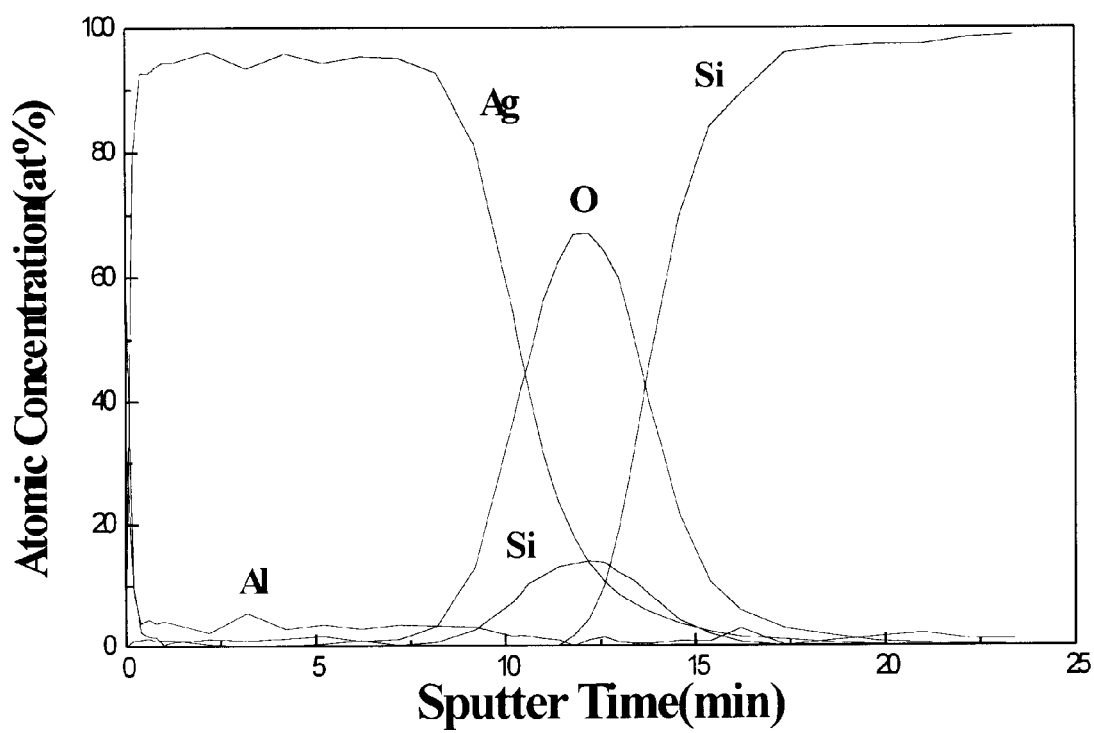
FIG. 5 is a graph illustrating the AES analysis results for a sample of an AgAl-based layer where heat-treatment is made at 400° C. under a vacuum atmosphere.

FIG. 2 is a graph illustrating the AES analysis results for a sample of an AgMg-based layer under deposition. FIG. 3 is a graph illustrating the AES analysis results for a sample of an AgMg-based layer that is heat-treated at 400° C. under a vacuum atmosphere. FIG. 4 is a graph illustrating the AES analysis results for a sample of an AgAl-based layer under deposition. FIG. 5 is a graph illustrating the AES analysis results for a sample of an AgAl-based layer that is heat-treated at 400° C. under a vacuum atmosphere.

In the graphs, the sputter etching time at the horizontal axis is established to be 8 min before the annealing, and 20 min after the annealing. This means that the measurement is made at the surface of the Ag alloy-based layer before the annealing, and to the interface between the Ag alloy-based layer and a lower layer thereof after the annealing.

AgMg or AgAl is sputtered at 150° C. An oxide layer of MgO or $Al_2O_3$ is formed on the surface of the Ag alloy-based layer directly after the sputtering.

The Mg or Al element moves to the interface between the Ag alloy-based layer and the silicon oxide layer at 400° C. under the vacuum atmosphere, and reacts with oxygen there while forming MgO or $Al_2O_3$. Considering that the oxygen content appears to present on the surface of the Ag alloy-based layer even before the annealing, it turns out that the oxygen content is segregated onto the surface of the target layer only with the temperature of deposition.

This result is due to the rapid diffusion speed as well as the surface segregation of the alloy content of Mg or Al. Particularly, Mg appears to be present only on the surface and the interface of the Ag alloy-based layer after the annealing. This means that the surface segregation effect of Mg is great.

Figure 6A:
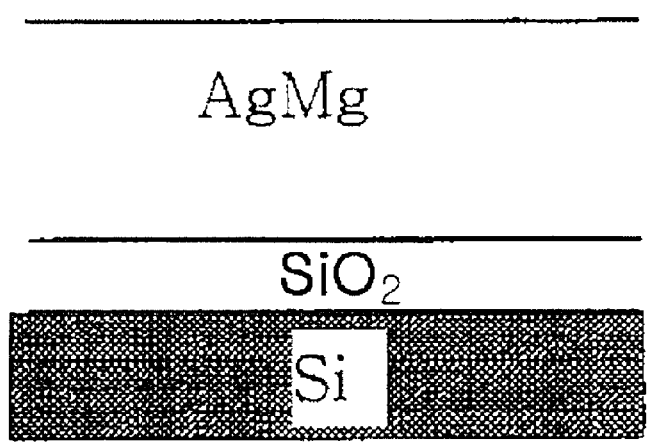
FIGS. 6A and 6B illustrate the process of forming an oxide layer on the surface and the interface of an Ag alloy-based layer through heat treatment.
Figure 6B:
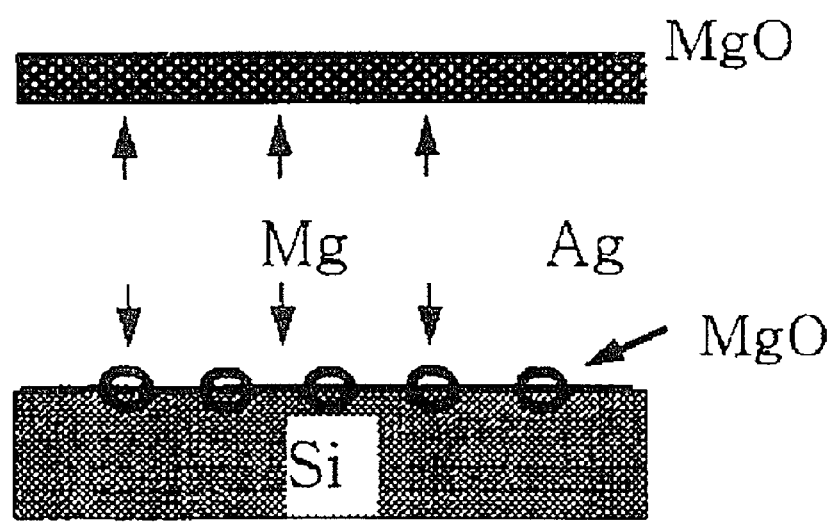

FIGS. 6A and 6B conceptually illustrate the theoretical background for the above data.

When the AgMg-based layer shown in FIG. 6A is heat-treated under an oxygen atmosphere, as shown in FIG. 6B, the Mg element moves to the layer surface to thereby form an oxide layer of MgO.

Furthermore, the Mg element also moves to the layer interface between the Ag alloy-based layer and the silicon oxide layer, and reacts with $SiO_2$ to thereby form MgO. This reaction may be expressed by the chemical formula 1.

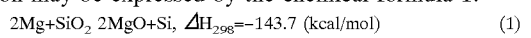

$$2Mg+SiO_2 \; 2MgO+Si, \; \Delta H_{298}=-143.7 \; (kcal/mol) \quad (1)$$

The alloy content is exhausted at the wiring line so that the wiring line bears lower resistivity close to that of pure Ag.

As described above, an oxide layer of the alloy element is formed at the surface and the interface between the Ag alloy-based layer and the silicon oxide layer. The oxide layer enhances the adhesion between the Ag alloy-based layer and the neighboring layers or the substrate. Particularly, when the underlying layer is based on silicon, such an oxide layer lowers contact resistance between the Ag alloy-based layer and the silicon-based layer, and prevents diffusion of the Ag content of the Ag alloy-based layer to the silicon-based layer. That is, the Ag alloy-based layer can contact the silicon-based layer in a stable manner.

Such a chemical reaction should be made at a low temperature that can be endured by glass. Furthermore, the alloy content of the Ag alloy-based layer should be exhausted so much as to sufficiently lower the resistivity thereof. In this respect, it becomes important to select alloy elements with a high diffusion speed.

Considering that the diffusion speed of the alloy element is closely related to the melting point, the diffusion speed of the alloy element to the surface and the interface of the Ag alloy-based layer is computed., And the melting point thereof is estimated based on the computed diffusion speed. In this way, suitable alloy elements can be determined.

Let's select an alloy element moving through an Ag-based thin film with a thickness of 0.3 $\mu$m for ten (10) minutes when the diffusion of the alloy element is made at 250° C.

The characteristic diffusion length can be expressed by the equation 2.

$$\sqrt{(D \times t)} = 0.3\ \mu m \qquad (2)$$

where D indicates the diffusion coefficient, and t indicates the period of time.

It results from the equation 2 that D=1.5E−12 cm$^2$/sec. Thus, it is preferable to select an alloy element having such a diffusion coefficient value or more.

Meanwhile, the particle interface diffusion controls the overall diffusion at the temperature lower than 0.5×Tm (Tm refers to the melting point of the alloy element). Thus, the equation 3 can be induced.

$$T < 0.5 \times Tm \qquad (3)$$

where T indicates the current temperature, and Tm indicates the melting point of the alloy element.

Furthermore, in the metallic material having a structure of face-centered cubic crystal(FCC), the diffusion coefficient thereof can be obtained by the equation 4.

$$D = 0.3 \times \exp(-8.5 \times Tm/T)\ cm^2/sec \qquad (4)$$

In consideration of such conditions, the available range of melting point and diffusion coefficient for suitable alloy elements can be determined.

Figure 7:
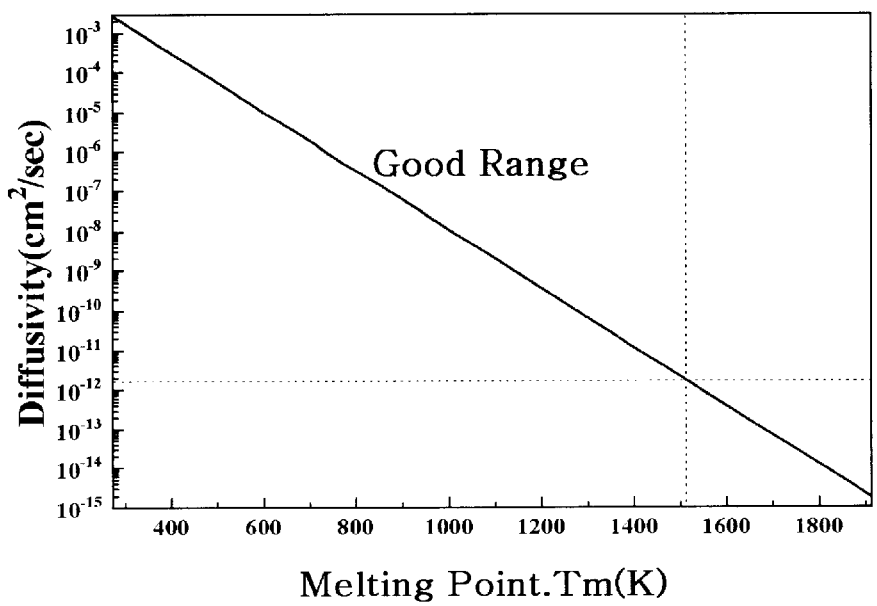
FIG. 7 is a graph illustrating the available range of melting points and diffusion coefficients of the alloy content for Ag alloy.

FIG. 7 graphically illustrates the equation 4 where T is replaced by 523K (250° C.). In the graph, the horizontal axis indicates the melting point Tm, and the vertical axis indicates the diffusion coefficient D.

It can be estimated from the graph that the melting point Tm should be 1500K or less to obtain a diffusion coefficient of 1.5E−12 cm$^2$/sec or more.

Figure 8:
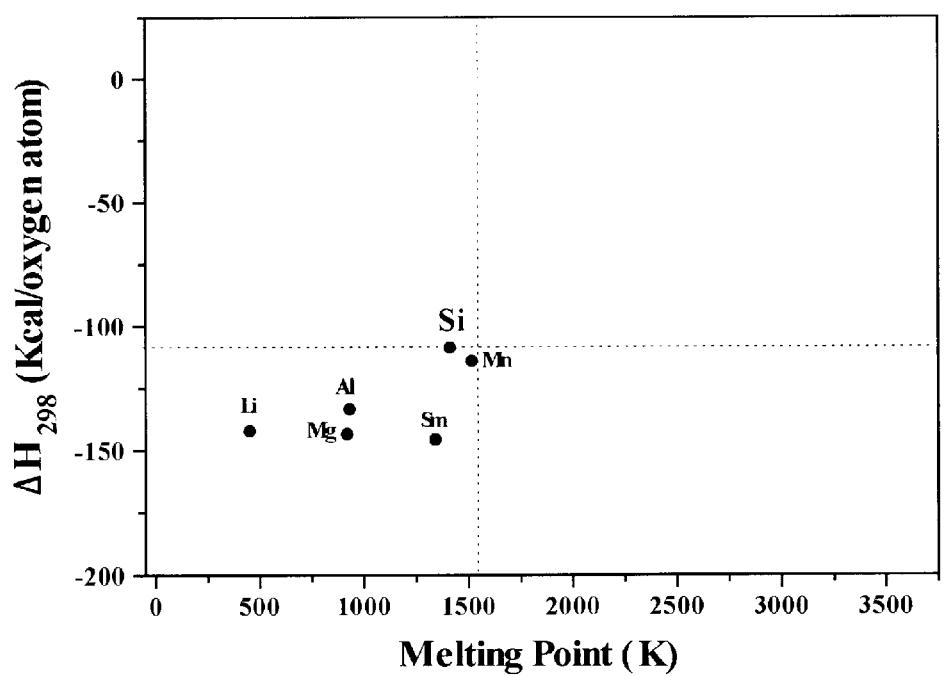
FIG. 8 is a graph illustrating the available range of melting points and enthalpies of the alloy content for Ag alloy.

FIG. 8 is a graph illustrating the available range of melting point and enthalpy for suitable alloy elements. In the graph, the alloy elements having a melting point lower than 1500K and an oxide formation energy greater than that of SiO$_2$ are exemplified.

As the metallic material bearing a low melting point exhibits lower surface energy, surface segregation thereof is liable to occur in a large scale. In this connection, as shown in FIG. 8, Li, Mg, Al, Sm or Mn is turned out to be a suitable alloy element.

The Ag alloy for the wiring line assembly may be based on a double-sourced alloy, a triple-sourced alloy, or a quadruple-sourced alloy selected from Ag, and Li, Mg, Al, Sm, or Mn.

The composition ratio of the alloy content to the Ag alloy should be 20at% or less in consideration of the resistivity of the Ag alloy. For instance, in the case of a quadruple-sourced alloy of Ag-a-b-c, it is preferable that the content ratio of a, b and c should be established to be 0.1at% $\leq a \leq$ 20at%, 0.1at% $\leq b \leq$ 20 at %, 0.1at% $\leq c \leq$ 20at%, and a+b+c $\leq$ 20 at %.

As described above, the Ag alloy with an alloy content of Li, Mg, Al, Sm or Mn may be used to form a low resistance wiring line assembly for a wide screen display device. In this case, the wiring line assembly can bear good contact characteristic with the neighboring layers while insuring the interface stability thereof.

Furthermore, it is possible to apply such an Ag alloy-based wiring line assembly for use in a reflection type liquid crystal display.

A thin film transistor array substrate with an Ag alloy-based wiring line assembly and a method for fabricating the same will be now explained with reference to the drawings.

Figure 9:
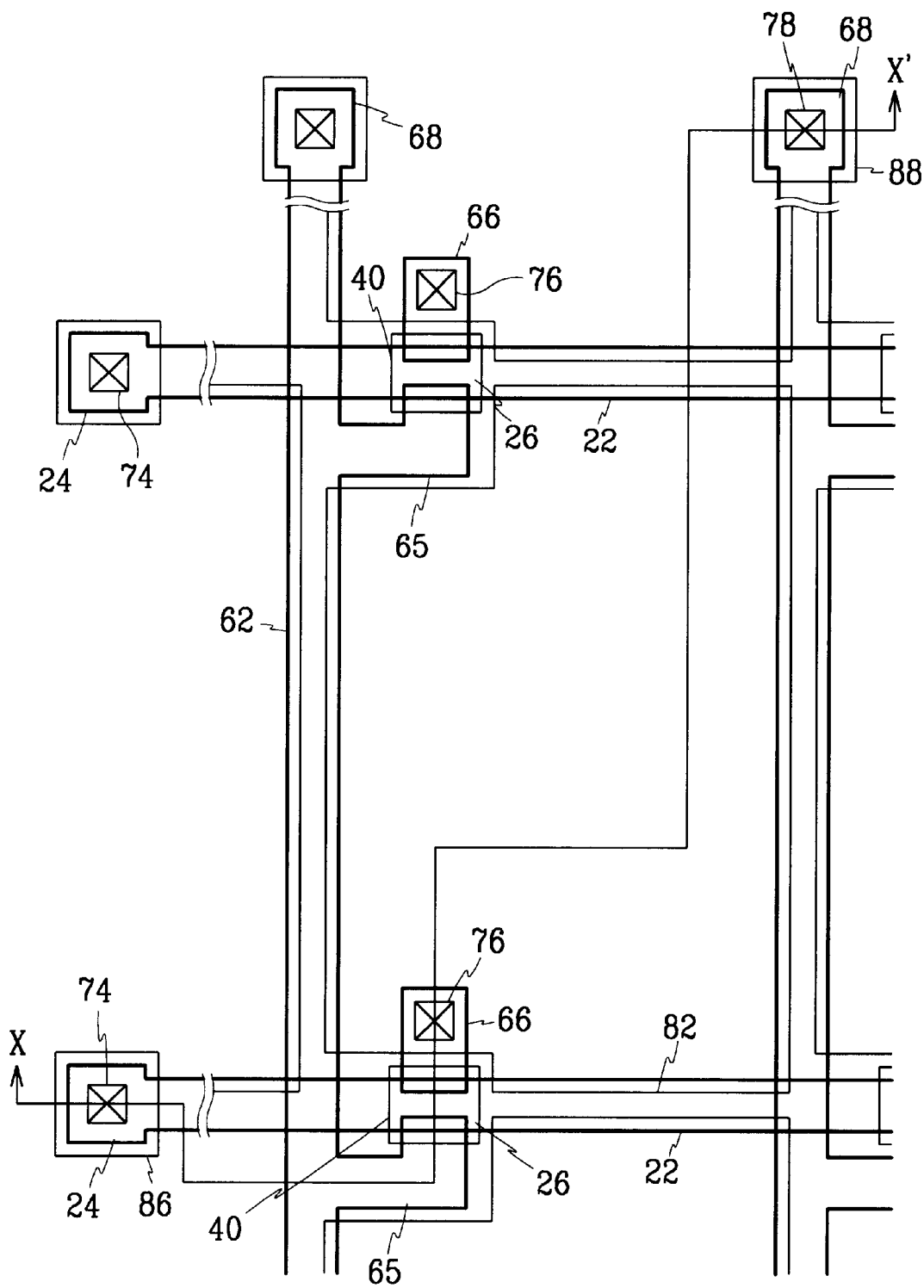
FIG. 9 is a plan view of a thin film transistor array substrate according to a first preferred embodiment of the present invention.
Figure 10:
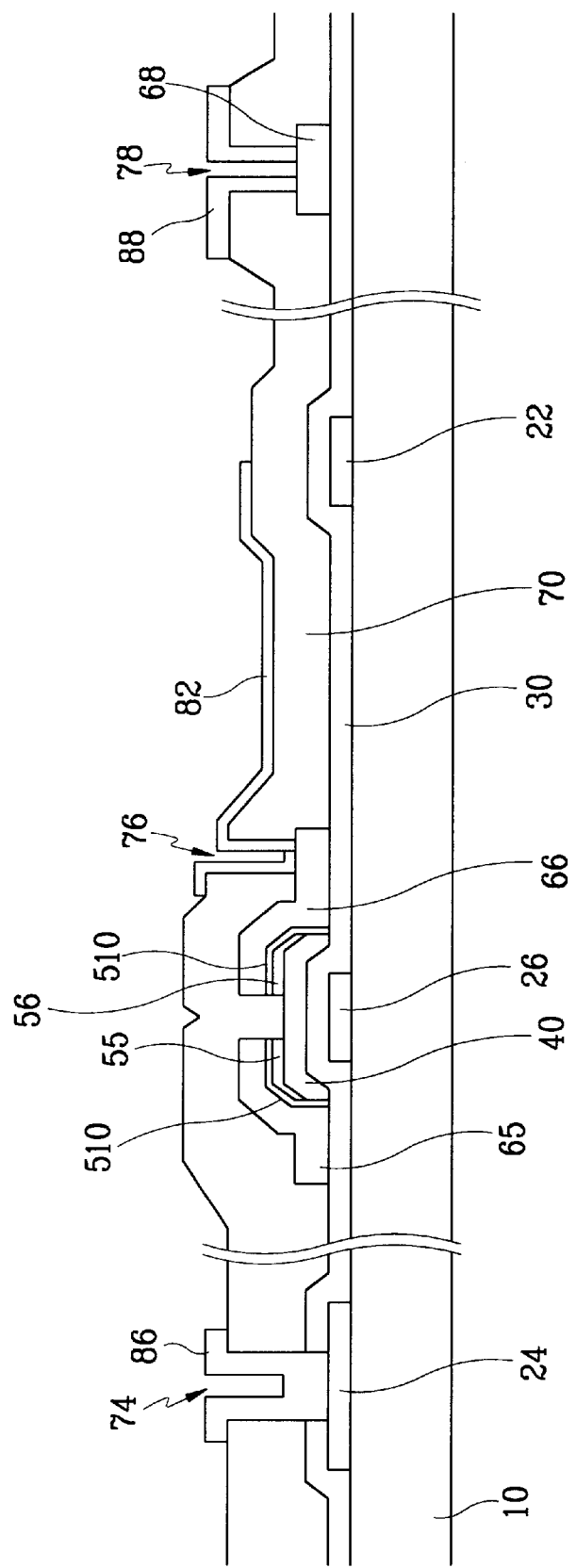
FIG. 10 is a cross sectional view of the thin film transistor array substrate taken along the X–X' line of FIG. 9.

FIG. 9 is a plan view of a thin film transistor array substrate according to a first preferred embodiment of the present invention, and FIG. 10 is a cross sectional view of the thin film transistor array substrate taken along the X–X' line of FIG. 9.

A gate line assembly is formed on an insulating substrate 10 with a silver (Ag) alloy bearing a low resistance. The gate line assembly includes a gate line 22 proceeding in the horizontal direction, a gate pad 24 connected to end of the gate line 22 to receive gate signals from the outside and transmit them to the gate line 22, and a gate electrode 26 for TFT connected to the gate line 22.

The Ag alloy for the gate line assembly is formed with a main content of Ag and an alloy content of metallic elements bearing a high diffusion coefficient and a low melting point. The alloy content may be selected from Li, Mg, Al, Sm, or Mn. It is preferable that the metallic elements for the alloy content bear a diffusion coefficient of 1.5E−12 cm$^2$/sec or more, and a melting point of 1500K or less.

One, two or three metallic elements may be used for the alloy content. That is, the Ag alloy for the gate line assembly may be a double-sourced alloy, a triple-sourced alloy, or a quadruple-sourced alloy. It is preferable that the composition ratio of the alloy content to the Ag alloy should be 20at% or less.

As the Ag alloy exhibits good adhesion characteristic with respect to glass, the gate line assembly tightly adheres to the substrate 10 without getting loose.

A gate insulating layer 30 is formed on the substrate 10 with silicon nitride to cover the gate line assembly.

An island-shaped semiconductor pattern 40 is formed on the gate insulating layer 30 over the gate electrode 24 with hydrogenated amorphous silicon. Ohmic contact patterns 55 and 56 are formed on the semiconductor pattern 40 with hydrogenated amorphous silicon where n-type impurities are doped at high concentration.

A metallic oxide layer 510 is formed on the ohmic contact patterns 55 and 56. The metallic oxide layer 510 may be formed of MgO, Al$_2$O$_3$, or Li$_2$O depending upon the material for a data line assembly to be described later. In case AgMg or AgAl is used for the data line assembly, the metallic oxide layer 510 is formed with MgO, or Al$_2$O$_3$.

The aforementioned data line assembly is formed on the metallic oxide layer 510 and the gate insulating layer 30 with an Ag alloy bearing a low resistance.

As like in the case of the gate line assembly, the Ag alloy for the data line assembly is formed with a main content of Ag, and an alloy content of metallic elements bearing a high diffusion coefficient and a low melting point. The alloy content may be selected from Li, Mg, Al, Sm, or Mn.

The data line assembly includes a data line 62 proceeding in the vertical direction while crossing over the gate line 22, a source electrode 65 branched from the data line 62 while being extended over the metallic oxide layer 510 on the one-sided ohmic contact pattern 55, a data pad 68 connected to the one-sided end of the data line 62 to receive picture signals from the outside, and a drain electrode 66 formed on the other-sided ohmic contact pattern 56 around the gate electrode 26 while being separated from the source electrode 65.

In this structure, the metallic oxide layer 510 is disposed between the Ag alloy-based layer for the data line assembly and the silicon-based layer for the ohmic contact patterns 55 and 56. The metallic oxide layer 510 lowers the contact resistance between the two neighboring layers while enhancing the adhesion thereof, and prevents diffusion of the Ag content of the Ag alloy-based layer to the silicon-based layer.

A protective layer 70 is formed on the data line assembly with silicon nitride.

Contact holes 76 and 78 exposing the drain electrode 66 and the data pad 68 are formed at the protective layer 70, and a contact hole 74 exposing the gate pad 24 together with the gate insulating layer 30 are also formed in the protective layer 70.

A pixel electrode 82 is formed on the protective layer 70 such that it is electrically connected to the drain electrode 66 through the contact hole 76. Furthermore, a subsidiary gate and a subsidiary data pads 86 and 88 are formed on the protective layer 70 such that they are connected to the gate and the data pads 24 and 68 through the contact holes 74 and 78. The pixel electrode 82, and the subsidiary gate and data pads 86 and 88 are formed with indium tin oxide (ITO) or indium zinc oxide (IZO).

A method for fabricating the thin film transistor array substrate will be now explained with reference to FIGS. 11A to 15B.

Figure 11A:
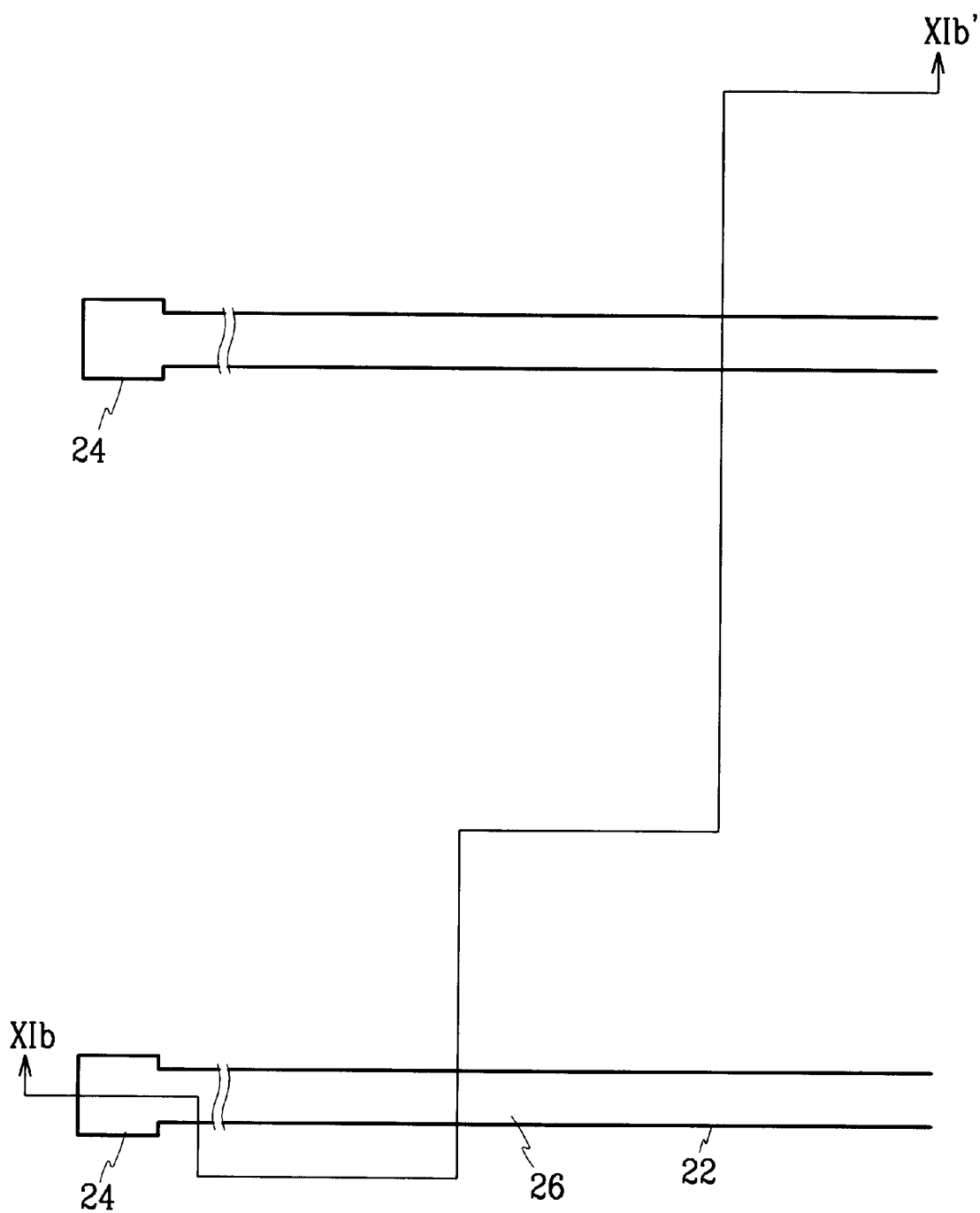
FIG. 11A illustrates the first step of fabricating the thin film transistor array substrate shown in FIG. 9.

As shown in FIGS. 11A and 11B, an Ag alloy-based layer is deposited onto a substrate 10, and patterned to thereby form a gate line assembly. The Ag alloy for the gate line assembly is formed with a main content of Ag, and an alloy content of metallic elements bearing a high diffusion coefficient and a low melting point.

The gate line assembly based on the Ag alloy can bear a low resistance characteristic, and a good adhesion characteristic to the glass substrate.

The temperature in fabricating a liquid crystal display is relatively low. This requires that the diffusion coefficient of the alloy element should be high. Therefore, the amount of oxygen in the Ag alloy-based layer should be reduced not to oxidize the highly oxidative alloy element. When the alloy element is oxidized in the Ag alloy-based layer, the diffusion speed of the alloy element is significantly reduced limiting the above-described effects. Therefore, in the process of depositing the Ag alloy-based layer for the gate line assembly, the oxygen in the Ag alloy target should be limited to 5000 ppm or less. Furthermore, the carbon and nitrogen should be also limited to 5000 ppm or less.

A metallic oxide layer (not shown) may be formed on the gate line assembly through heat treatment at 200° C. or more under an oxygen atmosphere. In case the gate line assembly is formed of AgMg, an oxide layer of MgO is formed at the interface thereof. In case the gate line assembly is formed of AgAl, an oxide layer of $Al_2O_3$ is formed at the interface thereof. In these cases, the alloy elements are diffused to the surface and the interface of the gate line assembly through the heat treatment. This reduces the resistivity of the gate line assembly, and enhances its adhesion to the substrate.

The gate line assembly may be naturally heat-treated at the subsequent process of depositing an insulating layer without requiring any separate process.

Figure 12A:
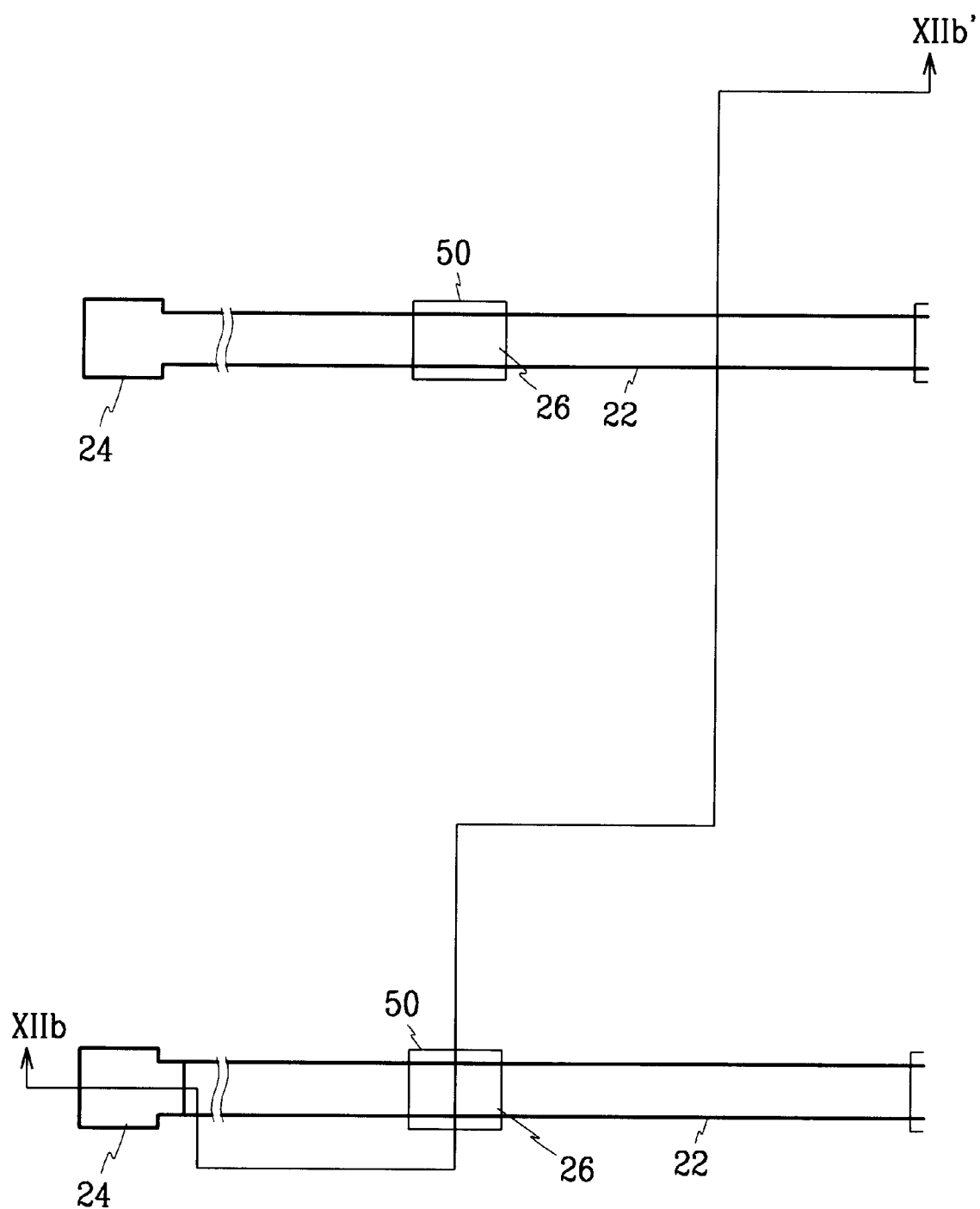
FIG. 12A illustrates the step of fabricating the thin film transistor array substrate shown in FIG. 9 following that illustrated in FIG. 11A.

Thereafter, as shown in FIGS. 12A and 12B, a silicon nitride-based gate insulating layer 30, a hydrogenated amorphous silicon-based layer 40, and an impurities-doped hydrogenated amorphous silicon-based layer 50 are sequentially deposited onto the substrate 10. The hydrogenated amorphous silicon-based layer 40, and the impurities-doped hydrogenated amorphous silicon-based layer 50 are patterned through photolithography to thereby form an island-shaped semiconductor pattern 40 and an island-shaped ohmic contact pattern 50 on the gate insulating layer 30 over the gate electrode 24.

Figure 13A:
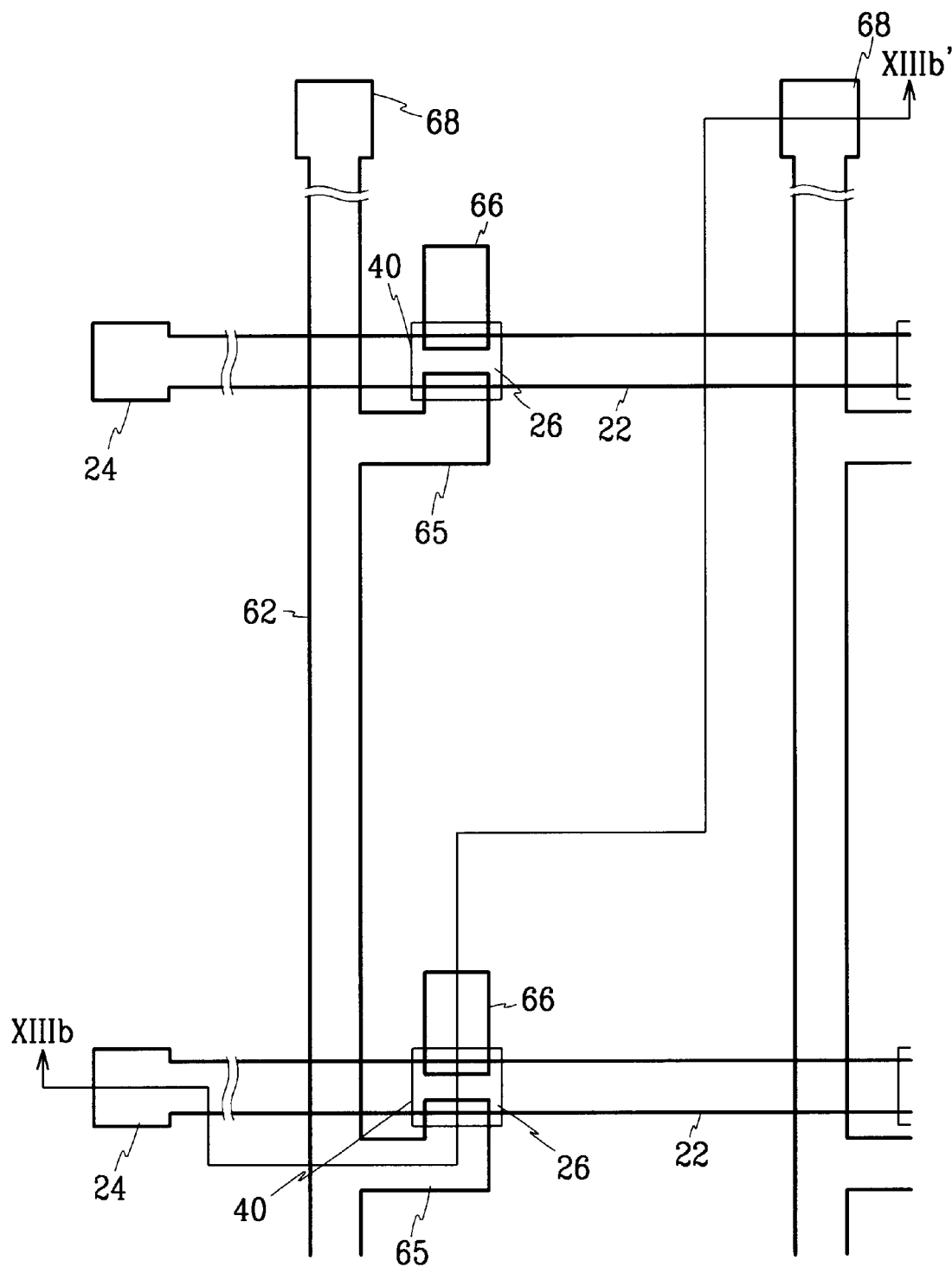
FIG. 13A illustrates the step of fabricating the thin film transistor array substrate shown in FIG. 9 following that illustrated in FIG. 12A.
Figure 13B:
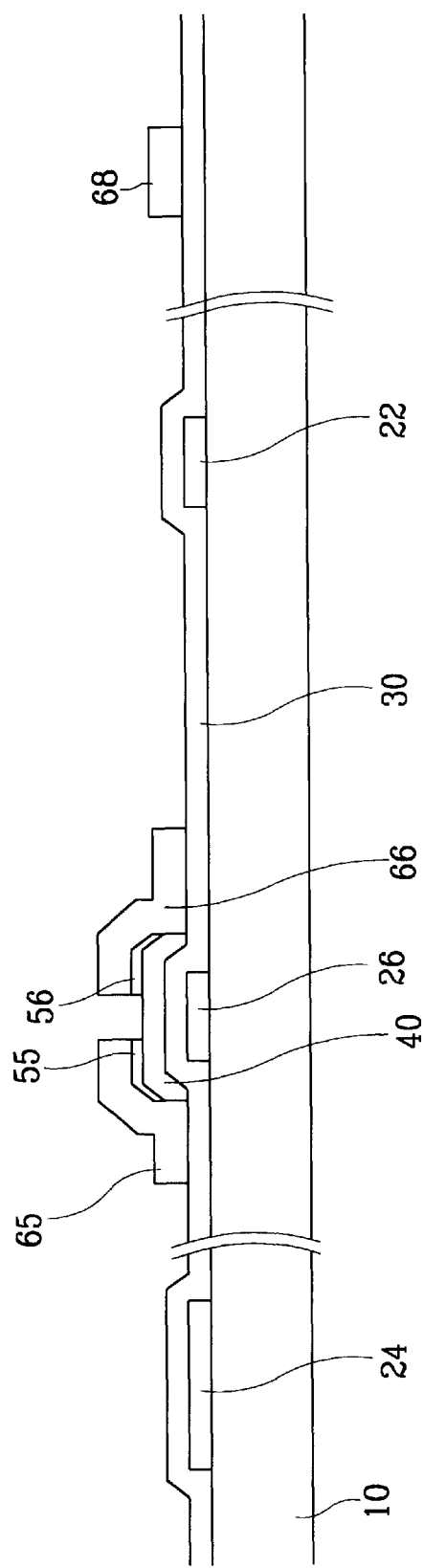
FIG. 13B is a cross sectional view of the thin film transistor array substrate taken along the XIIIb–XIIIb' line of FIG. 13A.

As shown in FIGS. 13A and 13B, an Ag alloy-based layer is deposited onto the ohmic contact pattern 50 and the gate insulating layer 30, and patterned through photolithography to thereby form a data line assembly. The Ag alloy for the data line assembly is formed with a main content of Ag, and an alloy content of metallic elements bearing a high diffusion coefficient and a low melting point.

The data line assembly includes a data line 62 crossing over the gate line 22, a source electrode 65 connected to the data line 62 while being extended over the gate electrode 26, a data pad 68 connected to one-sided end of the data line 62, and a drain electrode 66 separated from the source electrode 65 while facing the source electrode 65 around the gate electrode 26.

Thereafter, the ohmic contact pattern 50 exposed through the source and the drain electrodes 65 and 66 is etched such that it is divided into an ohmic contact pattern 55 contacting the source electrode 65, and an ohmic contact pattern 56 contacting the drain electrode 66.

Figure 14A:
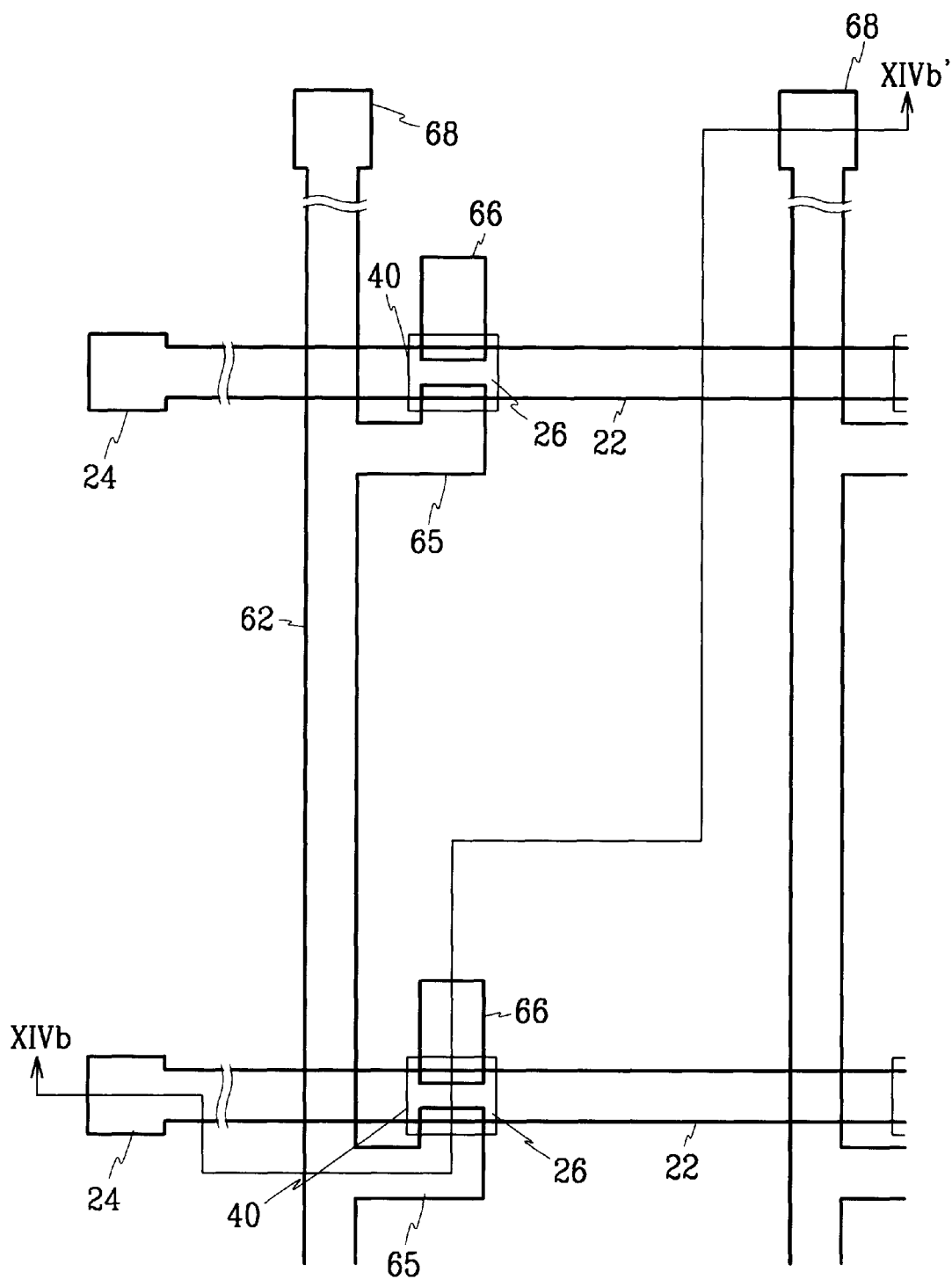
FIG. 14A illustrates the step of fabricating the thin film transistor array substrate shown in FIG. 9 following that illustrated in FIG. 13A.
Figure 14B:
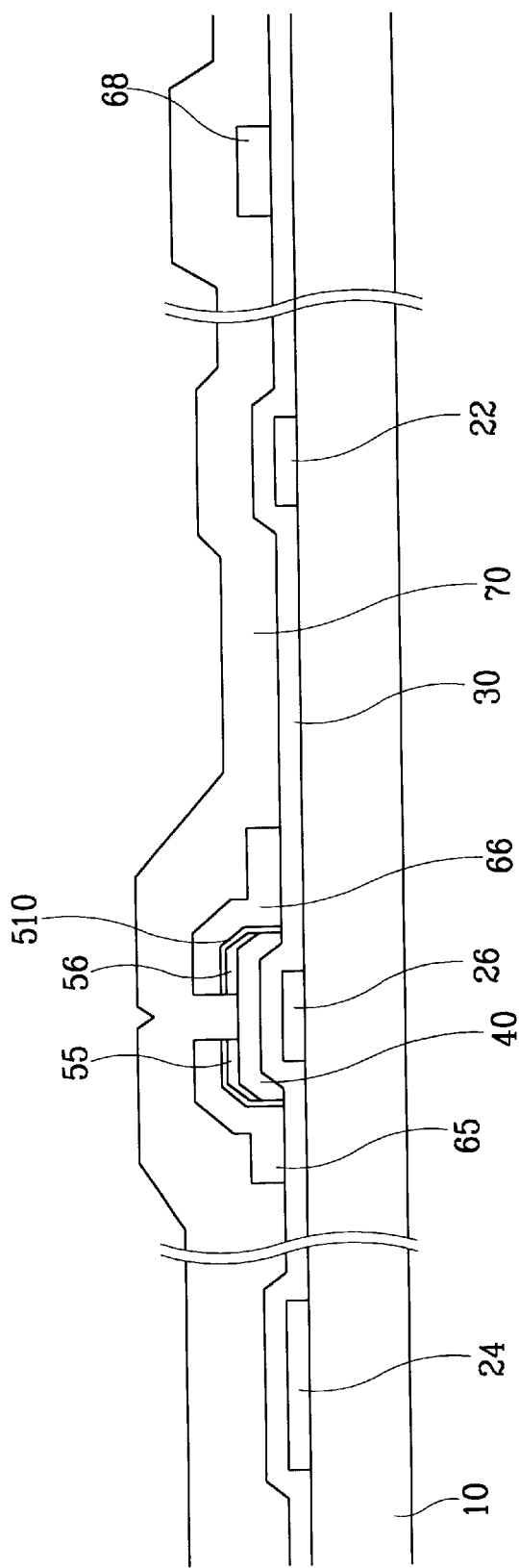
FIG. 14B is a cross sectional view of the thin film transistor array substrate taken along the XIVb–XIVb' line of FIG. 14A.

As shown in FIGS. 14A and 14B, a protective layer 70 is deposited onto the substrate 10 with an inorganic insulating material such as silicon nitride. It is preferable that the protective layer 70 should be deposited at the temperature range of 200° C. or more.

In the process of forming the protective layer 70, a metallic oxide layer 510 may be formed between the Ag alloy-based layer for the source and drain electrodes 65 and 66, and the silicon-based layers for the ohmic contact patterns 55 and 56 and the semiconductor pattern 40.

The metallic oxide layer 510 is based on a silicon oxide layer that is naturally formed on the silicon-based layers before forming the Ag alloy-based layer for the data line assembly.

The alloy elements of the Ag alloy-based layer are diffused to the interface while making the silicon oxide layer to be a dense-structured metallic oxide layer 510. In case the data line assembly is based on AgMg, MgO is formed at the interface thereof. In case the data line assembly is based on AgAl, $Al_2O_3$ is formed at the interface thereof.

The metallic oxide layer 510 lowers the contact resistance between the data line assembly and the silicon-based patterns 40, 55 and 56 while enhancing the adhesion therebetween. This serves to obtain a stable interface characteristic of the data line assembly. Furthermore, the alloy element is exhausted from the data line assembly so that the material content for the data line assembly bears a pure Ag characteristic, which reduces the resistivity.

In the usual case, surface of the silicon-based layers 40 and 50 is rinsed using HF before the formation of the data line assembly. However, even without the rinsing process using HF, the contact characteristic between the source and the drain electrodes 65 and 66 and the semiconductor pattern 40 as well as the ohmic contact patterns 55 and 56 can be improved by way of the interposed metallic oxide layer. Alternatively, in order to obtain such effects, a silicon oxide layer with 30 Å or less may be deposited onto the silicon-based layers through chemical vapor deposition (CVD).

Figure 15A:
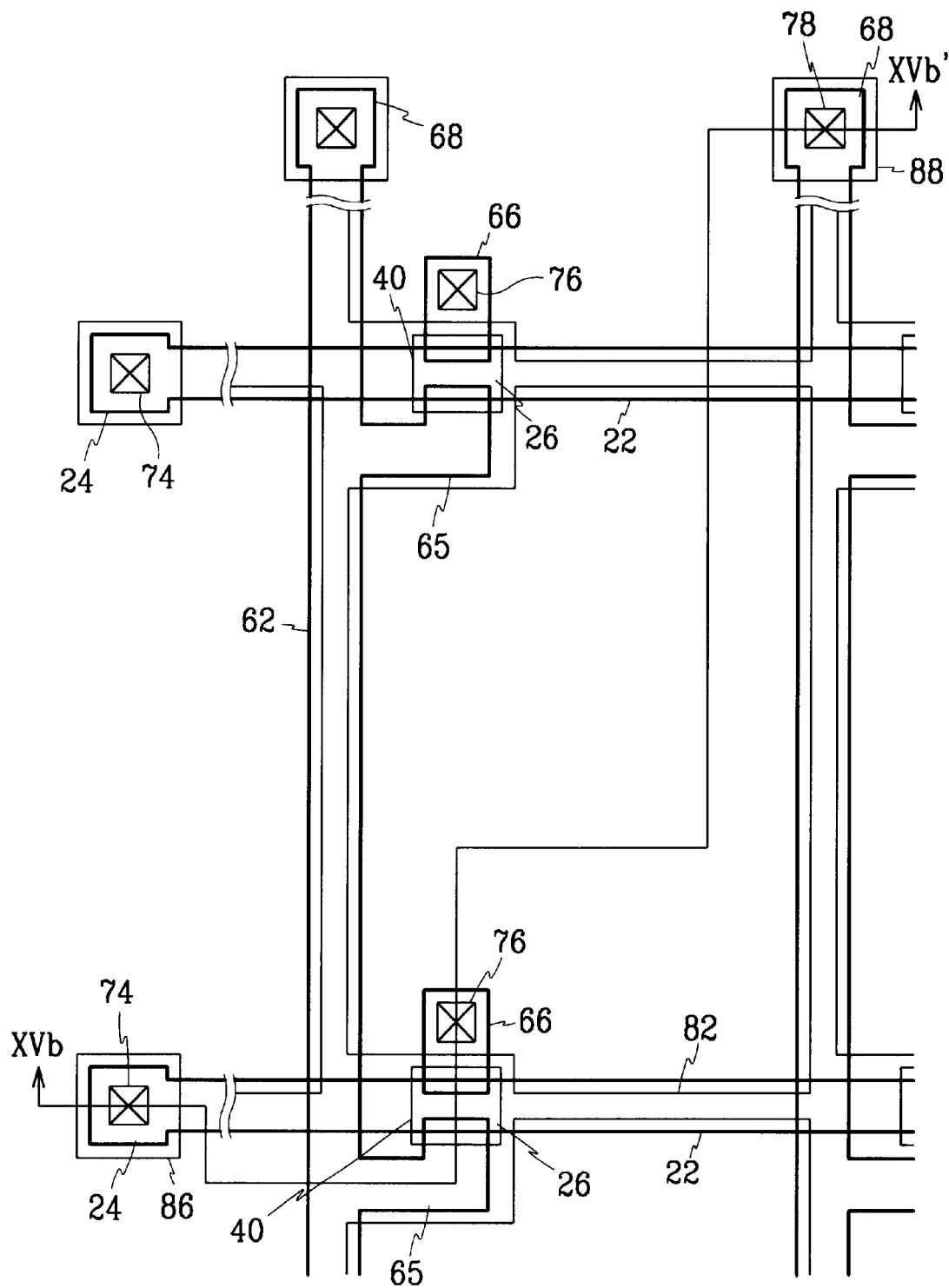
FIG. 15A illustrates the step of fabricating the thin film transistor array substrate shown in FIG. 9 following that illustrated in FIG. 14A.
Figure 15B:
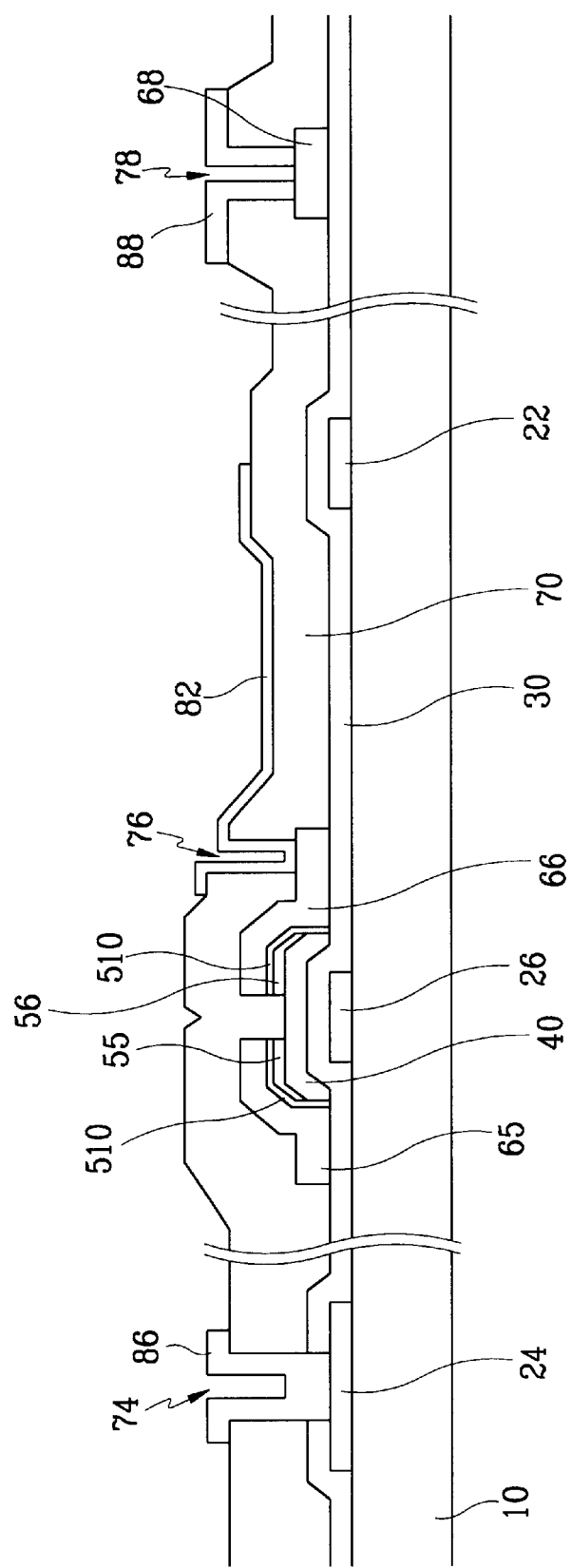
FIG. 15B is a cross sectional view of the thin film transistor array substrate taken along the XVb–XVb' line of FIG. 15A.

Thereafter, as shown in FIGS. 15A and 15B, the protective layer 70 is patterned together with the gate insulating layer 30 through photolithography to thereby form contact holes 74, 76 and 78 exposing the gate pad 24, the drain electrode 66, and the data pad 68.

An ITO or IZO-based layer is deposited onto the protective layer 70, and patterned through photolithography to thereby form a pixel electrode 82 connected to the drain electrode 66 through the contact hole 76, and a subsidiary gate and a subsidiary data pads 86 and 88 connected to the gate and the data pads 24 and 68 through the contact holes 74 and 78.

In the above-structured thin film transistor array substrate, the gate line assembly and the data line assembly are formed with an Ag alloy bearing a low resistance so that they can be well adapted for use in a wide-screened high definition liquid crystal display. Furthermore, they can reduce the contact resistance between the neighboring layers and can improve the adhesion therebetween.

The above structure can be applied to a thin film transistor array substrate using poly-crystalline silicon thin film transistors.

Figure 16:
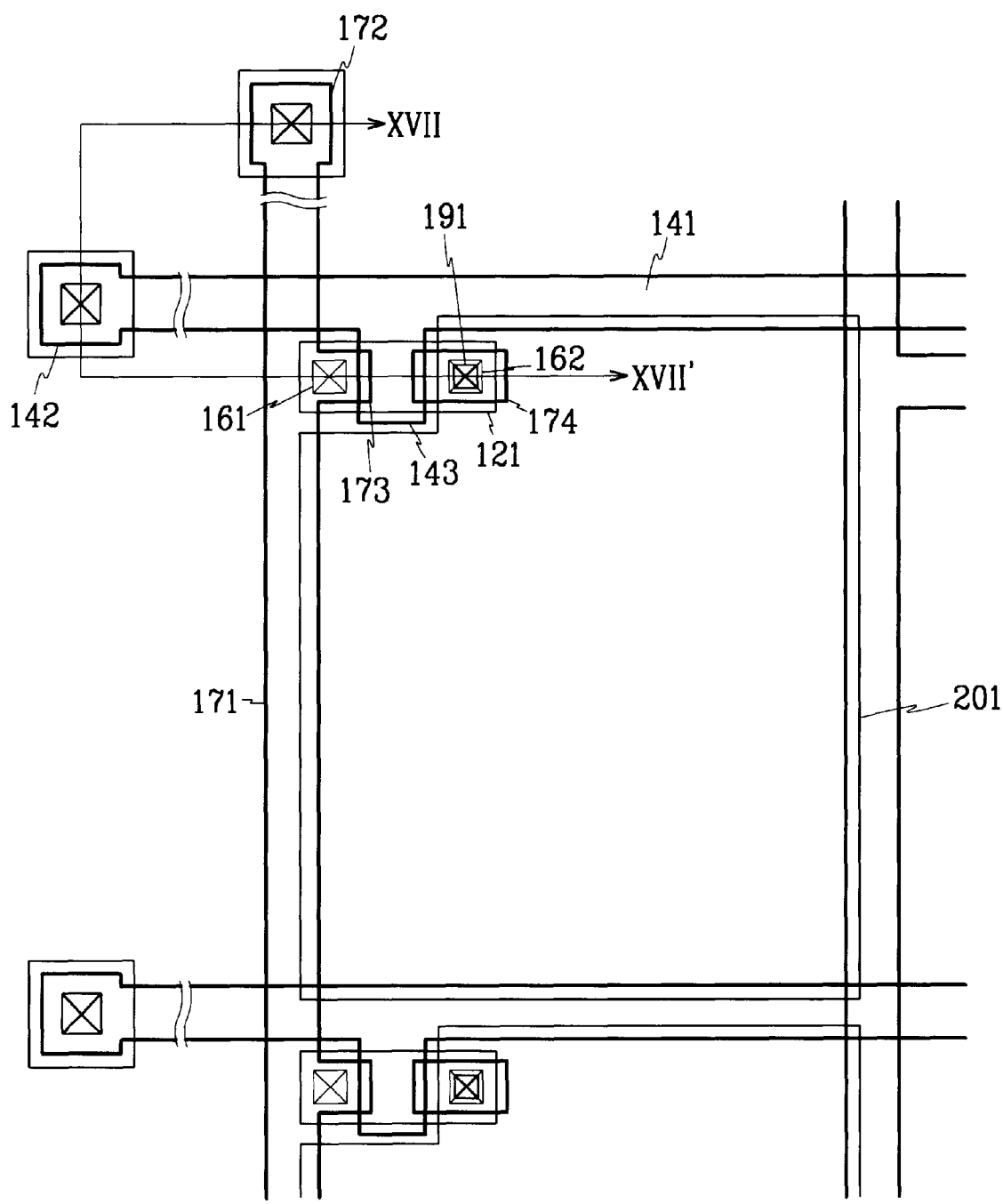
FIG. 16 is a plan view of a thin film transistor array substrate according to a second preferred embodiment of the present invention.
Figure 17:
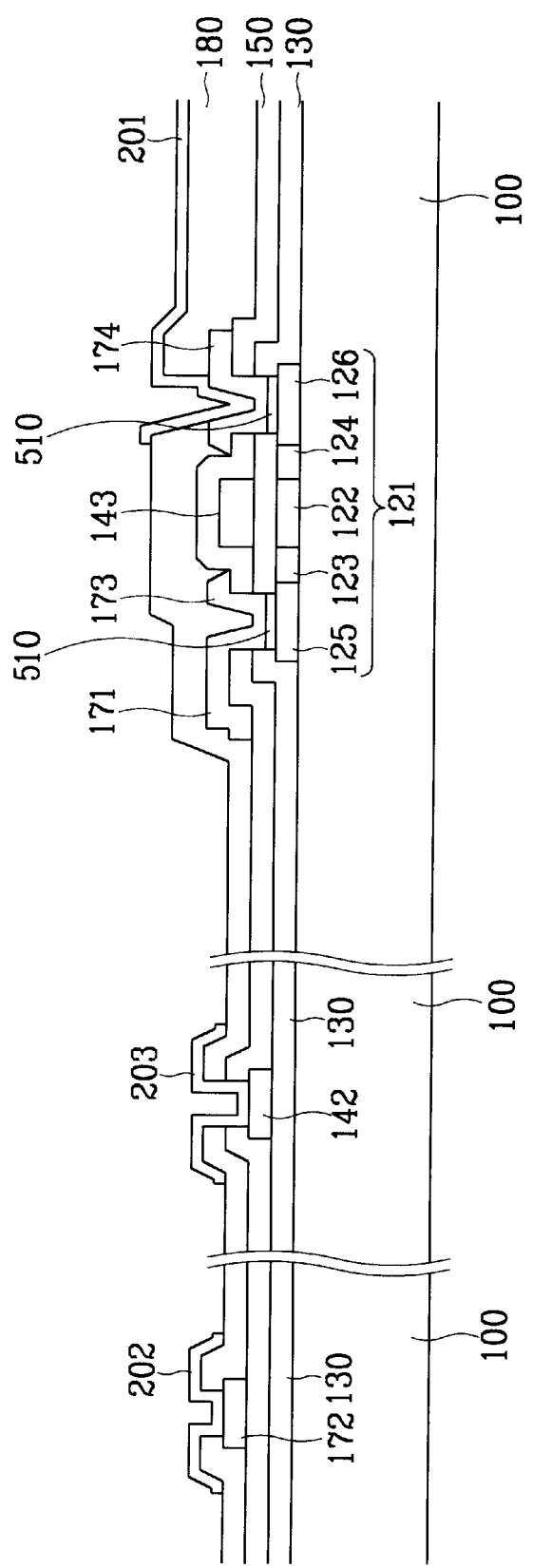
FIG. 17 is a cross sectional view of the thin film transistor array substrate taken along the XVII–XVII' line of FIG. 16.

FIG. 16 is a plan view of a thin film transistor array substrate according to a second preferred embodiment of the present invention. FIG. 17 is a cross sectional view of the thin film transistor array substrate taken along the XVII–XVII' line of FIG. 16.

An island-shaped semiconductor pattern 121 is formed on an insulating substrate 100 with poly-crystalline silicon. The semiconductor pattern 121 is formed with a channel region 122, a source and a drain regions 125 and 126 with high concentration impurities, and LDD regions with low concentration impurities placed between the channel and the source regions 122 and 125, and between the channel and the drain regions 122 and 126.

The LDD regions 123 and 124 are resistors that minimize leakage of current at an OFF state of the thin film transistor with a poly-crystalline semiconductor channel and components.

A gate insulating layer 130 is formed on the insulating substrate 100 while covering the semiconductor pattern 121.

A gate line assembly is formed on the gate insulating layer 130 with an Ag alloy. The Ag alloy for the gate line assembly is formed of a main content of Ag, and an alloy content of metallic materials bearing a high diffusion coefficient and a low melting point. The gate line assembly includes a gate line 141, a gate pad 142 connected to end of the gate line 141 to receive gate signals from the outside and transmit them to the gate line 141, and a gate electrode 143 connected to the gate line 141 corresponding to the channel region 122 of the semiconductor pattern 121.

As described above, if the gate line assembly is formed of an Ag alloy, it can bear a low resistance characteristic, and a stable interface characteristic.

An inter-layer insulating layer 150 based on silicon nitride covers the gate line assembly.

The inter-layer insulating layer 150 and the gate insulating layer 130 are provided with a contact hole 161 exposing the source region 125, and a contact hole 162 exposing the drain region 126.

A data line assembly is formed on the inter-layer insulating layer 150 with an Ag alloy. The Ag alloy for the data line assembly is formed with a main content of Ag, and an alloy content of metallic materials bearing a high diffusion coefficient and a low melting point. The data line assembly includes a data line 171 crossing over the gate line 141, a data pad 172 extended from end of the data line 171, a source electrode 173 protruded from the data line 171 while contacting the source region 125 of the semiconductor pattern 121, and a drain electrode 174 contacting the drain region 126 of the semiconductor pattern 121 while facing the source electrode 173.

A metallic oxide layer 510 is formed between the source electrode 173 and the source region 125 of the semiconductor pattern 121, and between the drain electrode 174 and the drain region 126 of the semiconductor pattern 121.

The metallic oxide layer 510 may be formed of MgO, $Al_2O_3$, or $Li_2O$ depending upon the material for the data line assembly. If the data line assembly is based on AgMg or AgAl, a metallic oxide layer would be MgO or $Al_2O_3$.

The metallic oxide layer 510 is formed between the Ag alloy-based layer for the source and the drain electrodes 173 and 174 and the silicon-based layer for the semiconductor pattern 121 to lower the contact resistance between the two layers while enhancing the adhesion therebetween. Furthermore, the metallic oxide layer 510 provides a cleaner interface that prevents the Ag element of the Ag alloy-based layer from diffusing into the silicon-based layer.

A protective layer 180 is formed of silicon nitride to cover the data line assembly.

The protective layer 180 is provided with contact holes 191 and 192 exposing the drain electrode 174 and the data pad 172, and a contact hole 193 exposing the gate pad 142 together with the inter-layer insulating layer 150.

A pixel electrode 201 is formed on the protective layer 180 such that is electrically connected to the drain electrode 174 through the contact hole 191. Furthermore, a subsidiary data and subsidiary gate pads 202 and 203 are formed on the protective layer 180 such that they are connected to the data and gate pads 172 and 142 through the contact holes 192 and 193. The pixel electrode 201, and the subsidiary data and gate pads 202 and 203 are formed of ITO or IZO.

A method for fabricating the thin film transistor array substrate will be now explained with reference to FIGS. 18A through 22B.

Figure 18A:
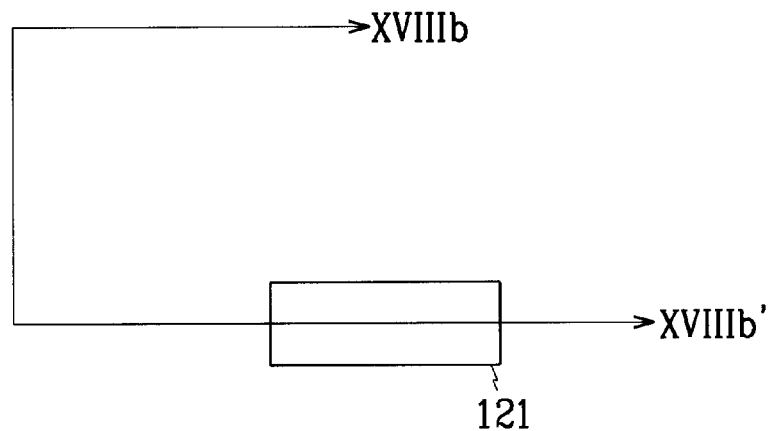
FIG. 18A illustrates the first step of fabricating the thin film transistor array substrate shown in FIG. 16.
Figure 18A:
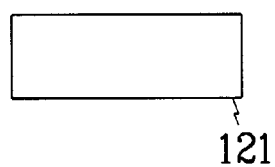

As shown in FIGS. 18A and 18B, a poly-crystalline silicon-based layer is formed on an insulating substrate 100, and patterned through photolithography to form an island-shaped semiconductor pattern 121.

The poly-crystalline silicon layer may be formed through depositing an amorphous silicon-based layer onto the substrate, and crystallizing the amorphous silicon by way of a silicon crystallization technique such as laser annealing, or high temperature solidification.

Figure 19A:
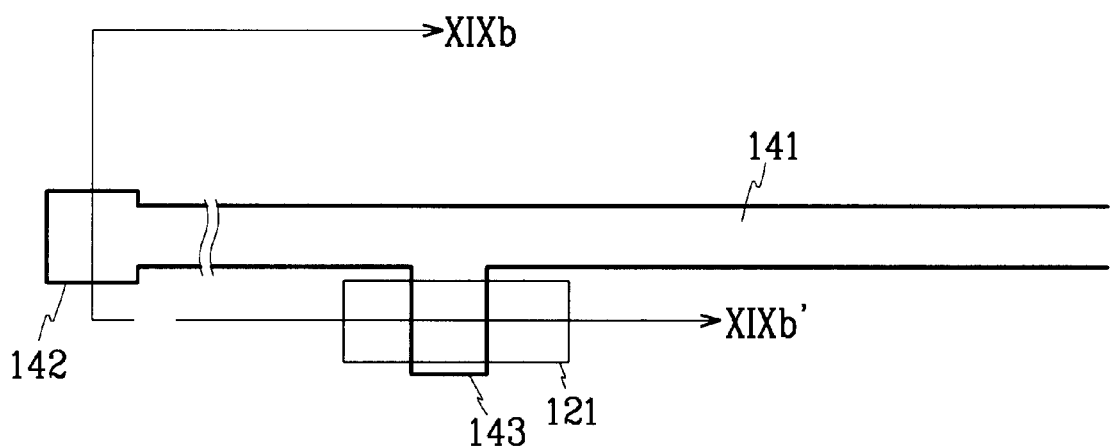
FIG. 19A illustrates the step of fabricating the thin film transistor array substrate shown in FIG. 16 following that illustrated in FIG. 18A.
Figure 19A:
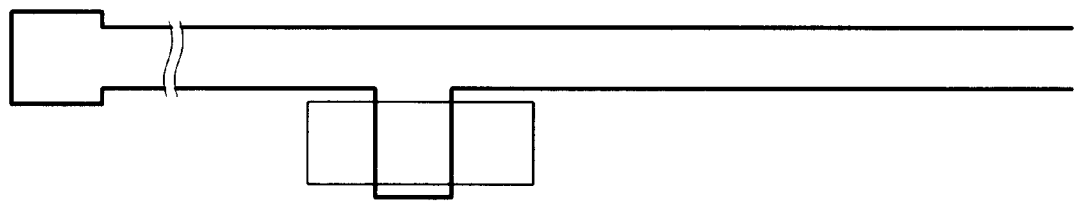

Thereafter, as shown in FIGS. 19A and 19B, a gate insulating layer 130 is formed on the substrate 100 such that it covers the semiconductor pattern 121. An Ag alloy-based layer is deposited onto the gate insulating layer 130, and patterned to thereby form a gate line assembly. The Ag alloy for the gate line assembly is formed with a main content of Ag, and an alloy content of metallic elements having a high diffusion coefficient and a low melting point. The gate line assembly includes a gate line 141, a gate pad 142, and a gate electrode 143.

Figure 20A:
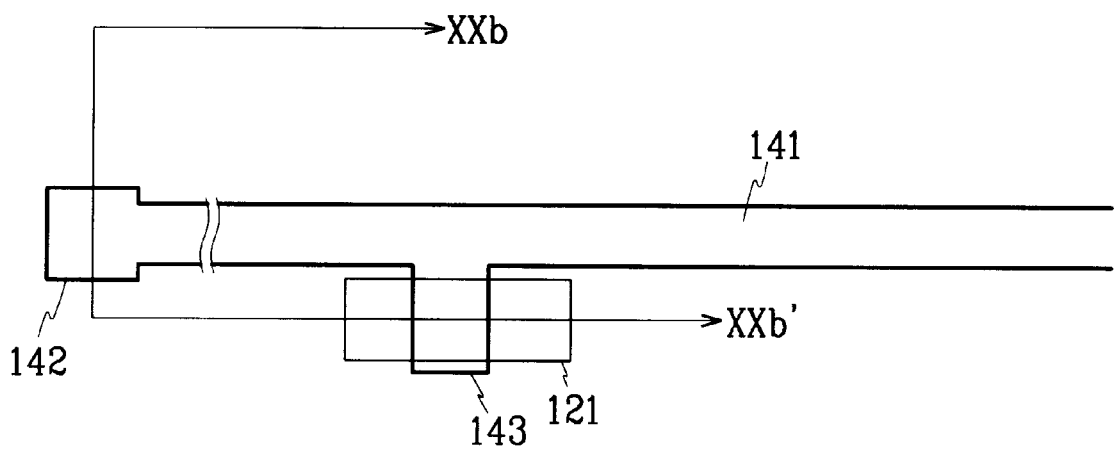
FIG. 20A illustrates the step of fabricating the thin film transistor array substrate shown in FIG. 16 following that illustrated in FIG. 19A.
Figure 20A:
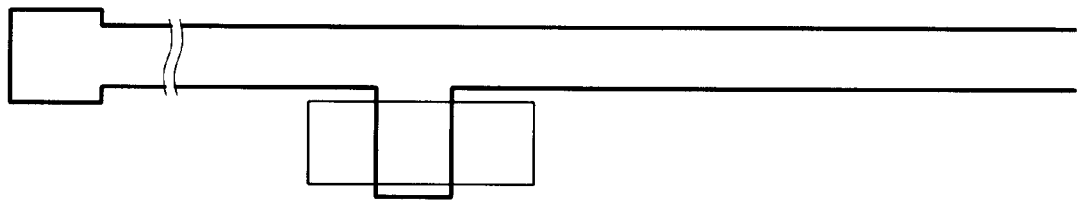

As shown in FIGS. 20A and 20B, a source and a drain regions 125 and 126 with high concentration impurities, and LDD regions 123 and 124 with low concentration impurities are formed at the semiconductor pattern 121. The portion of the semiconductor pattern 121 overlapped by the gate electrode 143 and not doped with impurities becomes a channel region 122.

In order to form such impurity-doped regions 123, 124, 125 and 126 in the semiconductor pattern 121, the semiconductor pattern 121 except for the channel portion is doped with n-type impurities at low concentration while using the gate electrode 143 as a mask. Then, covering with a doping mask the gate electrode 143, the channel region 122 and the LDD regions 123 and 124 of the semiconductor pattern 121 are doped with n-type impurities at high concentration through the doping mask to dope the periphery of the semiconductor pattern 121 not blocked by the doping mask at high concentration.

At this time, the periphery of the semiconductor pattern 121 doped at low concentration and re-doped at high concentration becomes to be the source and the drain regions 125 and 126 with high concentration impurities., The portions of the semiconductor pattern 121 doped at low concentration becomes the LDD regions 123 and 124 with low concentration impurities, and the portions of the semiconductor pattern 121 that is not doped becomes the channel region 122.

The order of low concentration doping process and the high concentration doping process may be reversed.

Figure 21A:
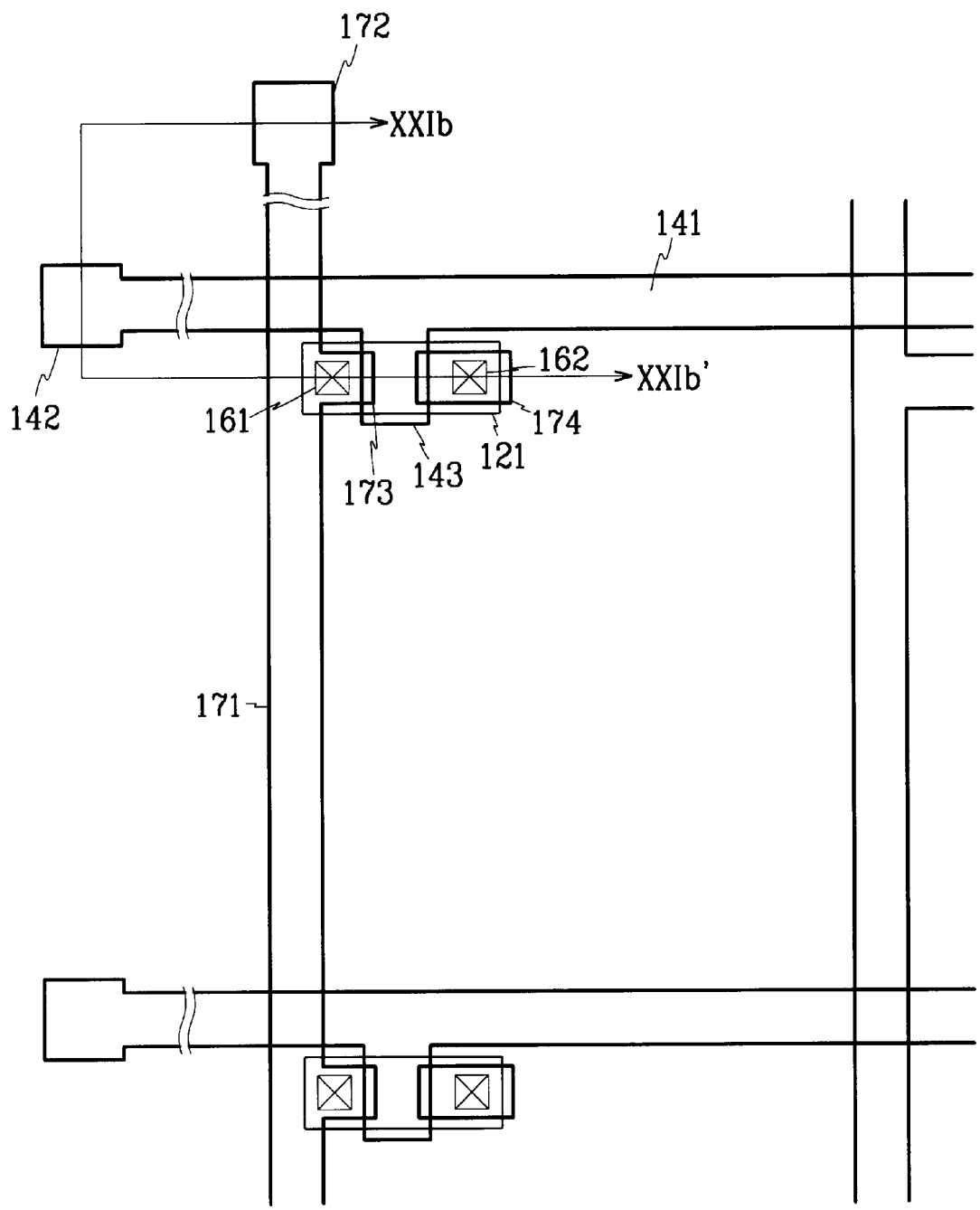
FIG. 21A illustrates the step of fabricating the thin film transistor array substrate shown in FIG. 16 following that illustrated in FIG. 20A.

Thereafter, as shown in FIGS. 21A and 21B, an inter-layered insulating layer 150 is formed on the entire surface of the substrate 100 while covering the gate line assembly. The inter-layered insulating layer 150 and the gate insulating layer 130 are patterned through photolithography to thereby form a contact hole 161 exposing the source region 125, and a contact hole 162 exposing the drain region 126.

An Ag alloy-based layer is then deposited onto the inter-layered insulating layer 150, and patterned to thereby form a data line assembly. The Ag alloy for the data line assembly is formed with a main content of Ag, and an alloy content of metallic elements having a high diffusion coefficient and a low melting point. The data line assembly includes a data line 171 crossing over the gate line 141, a source electrode 173 connected to the data line 171 while contacting the source region 125 through the contact hole 161, a data pad 172 connected to one end of the data line 141, and a drain electrode 174 separated from the source electrode 173 while contacting the drain region 126 through the contact hole 162.

Figure 22A:
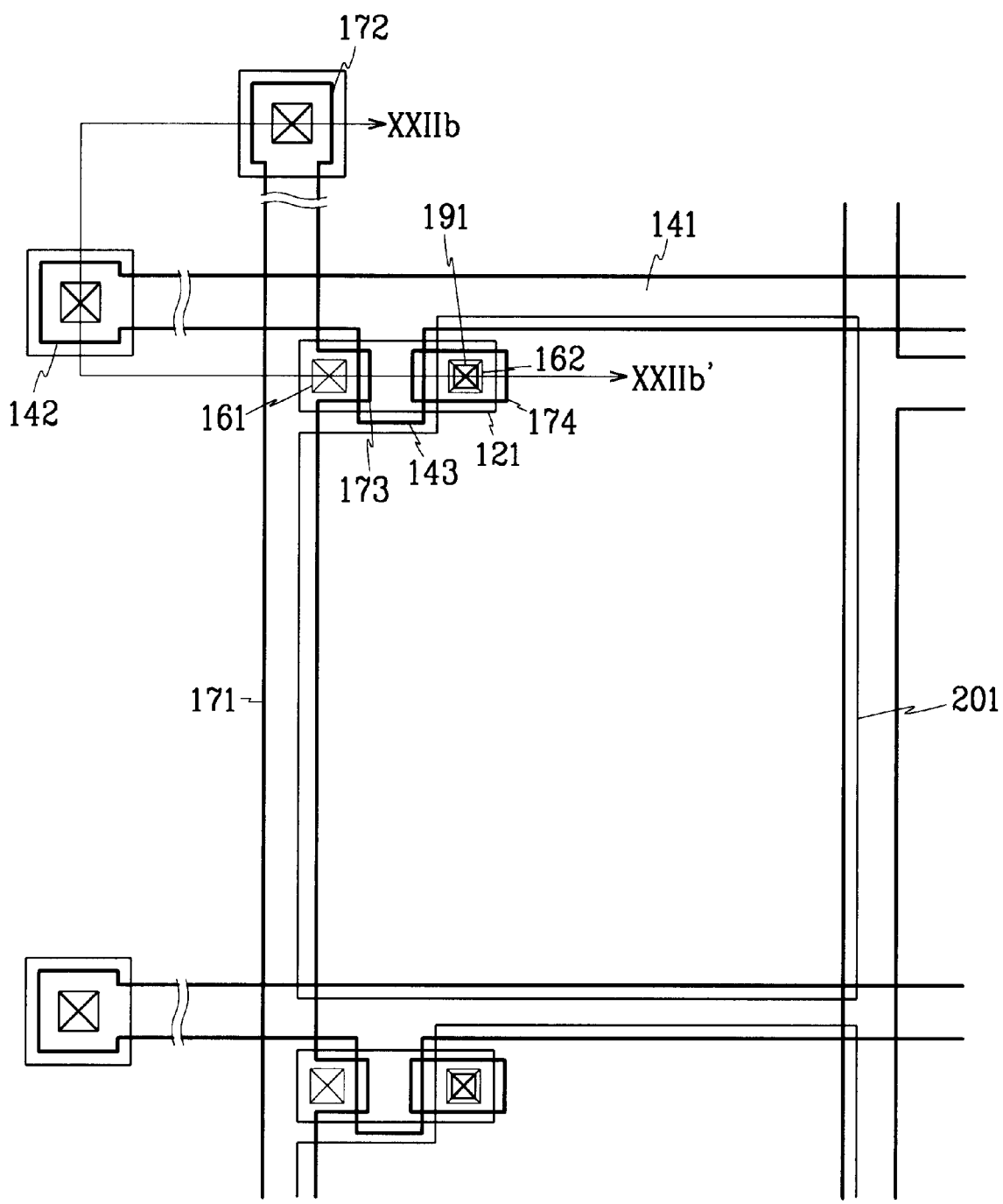
FIG. 22A illustrates the step of fabricating the thin film transistor array substrate shown in FIG. 16 following that illustrated in FIG. 21A.
Figure 22B:
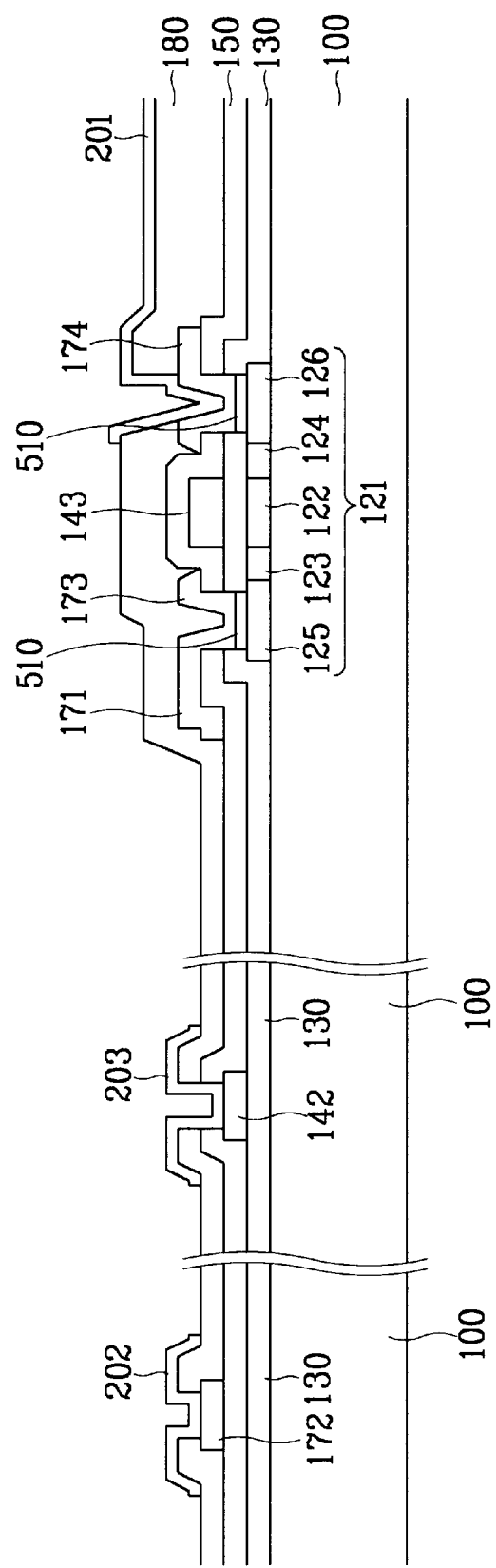
FIG. 22B is a cross sectional view of the thin film transistor array substrate taken along the XXIIb–XXIIb' line of FIG. 22A.

Thereafter, as shown in FIGS. 22A and 22B, a protective layer 180 is deposited onto the substrate 100 with an inorganic insulating material such as silicon nitride. It is preferable that the protective layer 180 is deposited at the temperature range of 200° C. or more.

In the heat treatment process for forming the protective layer 180, a metallic oxide layer 510 may be formed between the source electrode 173 and the semiconductor pattern 121, and between the drain electrode 174 and the semiconductor pattern 121. The metallic oxide layer 510 is formed due to a silicon oxide layer naturally formed on the semiconductor pattern before forming the Ag alloy-based layer for the data line assembly.

In the heat treatment process for forming the protective layer 180, the alloy elements of the Ag alloy-based layer for the data line assembly is diffused to the interface and make the silicon oxide layer to be a dense-structured metallic oxide layer 520. If the data line assembly is based on AgMg, a metallic oxide layer of MgO is formed at the interface. If the data line assembly is based on AgAl, a metallic oxide layer of $Al_2O_3$ is formed at the interface.

The metallic oxide layer 510 lowers the contact resistance between the data line assembly and the semiconductor pattern 121 and enhances the adhesion therebetween.

Figure 23A:
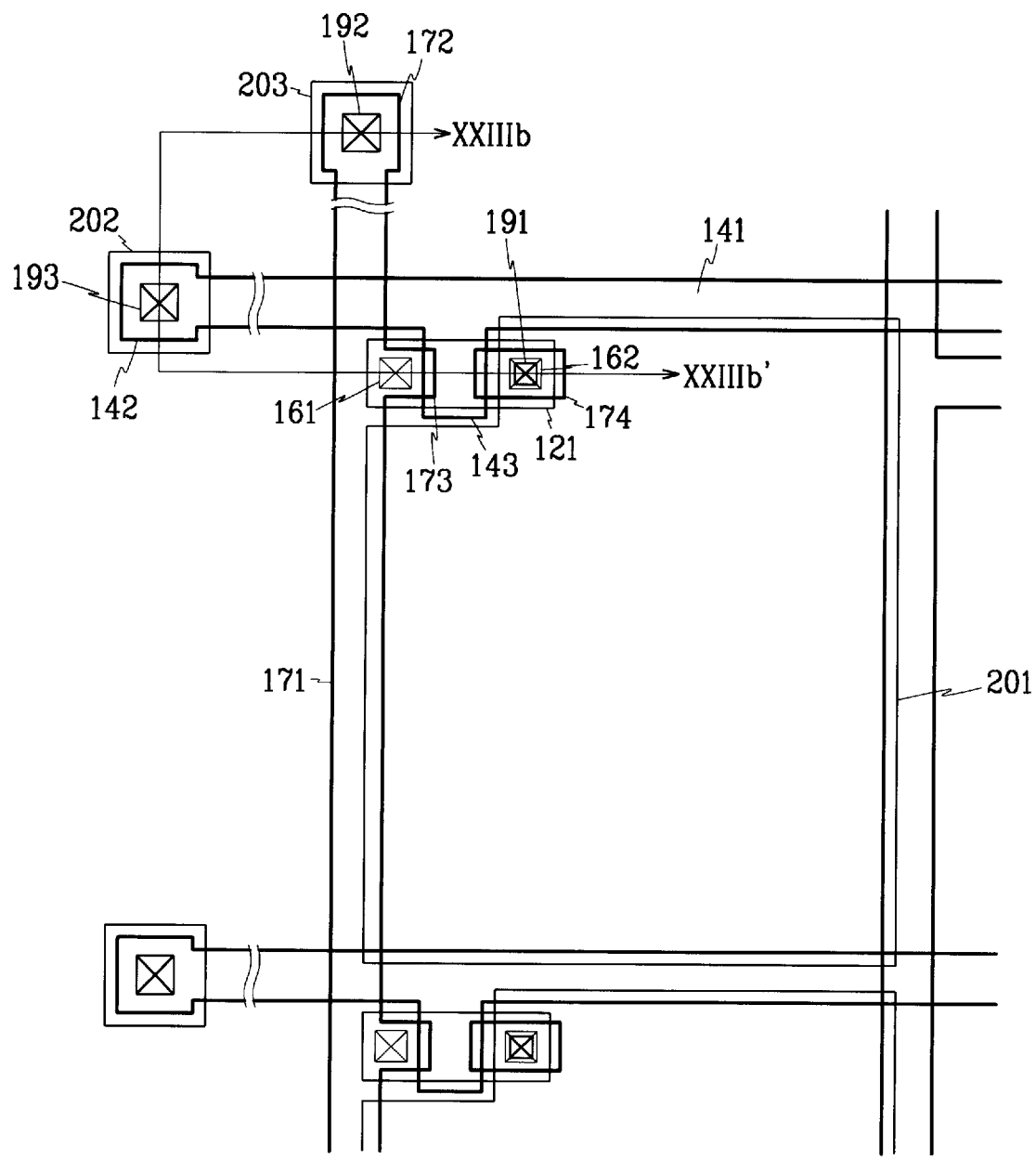
FIG. 23A illustrates the step of fabricating the thin film transistor array substrate shown in FIG. 16 following that illustrated in FIG. 22A.
Figure 23B:
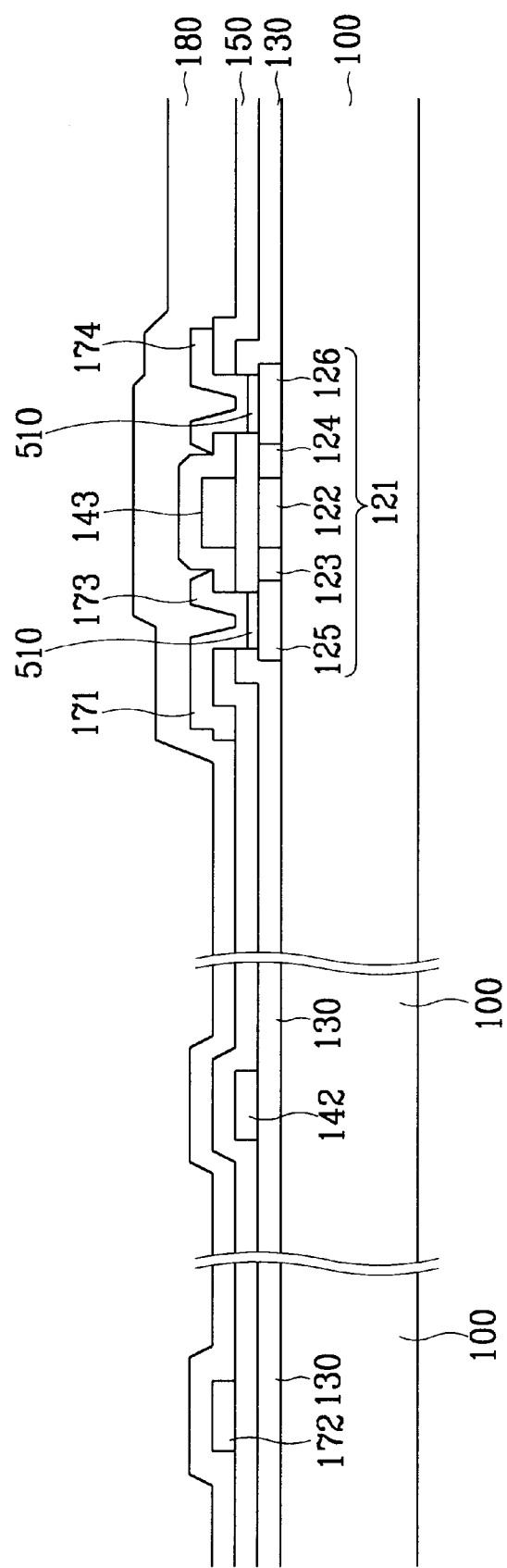
FIG. 23B is a cross sectional view of the thin film transistor array substrate taken along the XXIIIb–XXIIIb' line of FIG. 23A.

Thereafter, as shown in FIGS. 23A and 23B, the protective layer 180 is patterned through photolithography to thereby form a contact hole 191 exposing the drain electrode 174, and a contact hole 192 exposing the data pad 172. Furthermore, the protective layer 180 is patterned together with the inter-layer insulating layer 150 to thereby form contact holes 193 exposing the gate pads 142.

Finally, an ITO or IZO-based layer is deposited onto the protective layer 180, and patterned through a mask to thereby form a pixel electrode connected to the drain electrode 174 through the contact hole 191, and a subsidiary data and a subsidiary gate pads 202 and 203 connected to the data and the gate pads 172 and 142 through the contact holes 192 and 193.

In the thin film transistor array substrate according to the second preferred embodiment of the present invention, the gate line assembly and the data line assembly are formed with an Ag alloy bearing a low resistance. Consequently, such a thin film transistor array substrate can be well adapted for use in a wide-screen high definition liquid crystal display. Furthermore, the contact resistance between the neighboring layers can be reduced.

Figure 24:
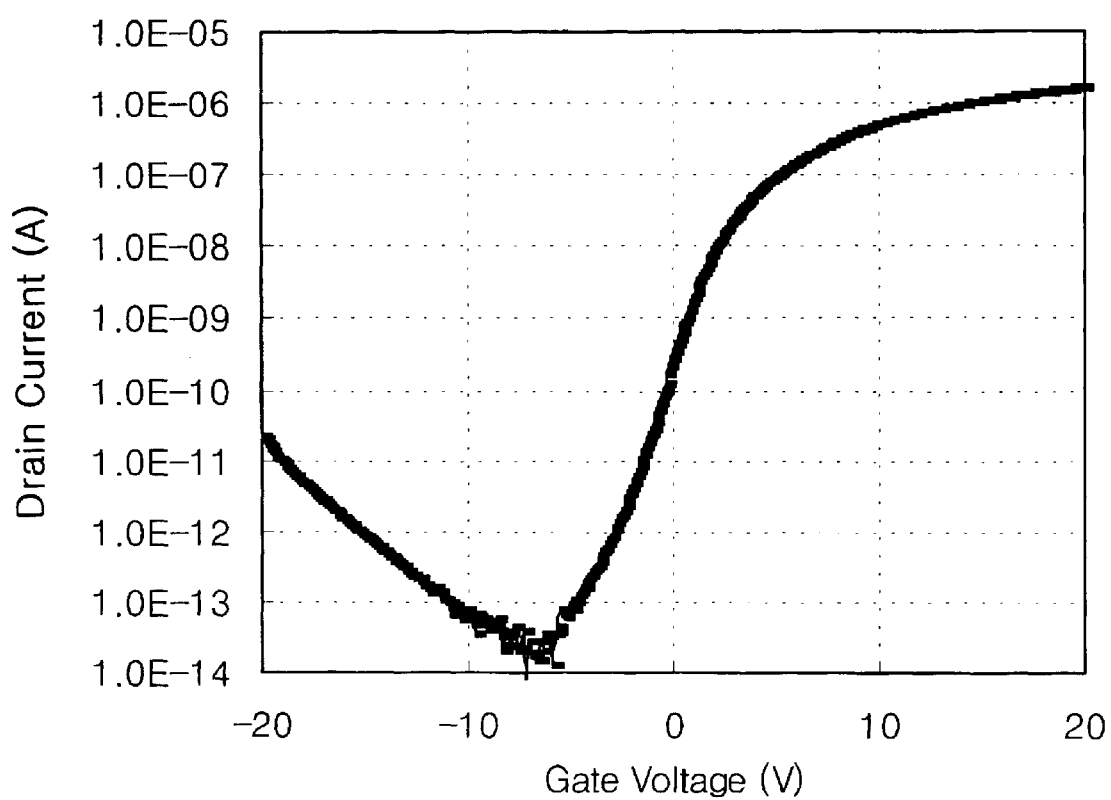
FIG. 24 is a graph illustrating the on/off current characteristic of a thin film transistor for a thin film transistor array substrate according to the present invention.

FIG. 24 is a graph illustrating the electrical characteristics of a thin film transistor with Ag alloy-based electrodes.

A gate electrode of 2000–4000 Å is formed with Ag alloy, and a gate insulating layer of 4500 Å is formed with SiNx. A semiconductor layer of 500 Å is formed with a–Si, and an ohmic contact layer of 2500 Å is formed with n+a–Si. Source and drain electrodes of 2000–4000 Å is formed of an Ag alloy. In this structure, drain currents as a function of gate voltages are illustrated in the graph.

In the graph, the ON current is 0.1 pA when the gate voltage is –5V. The OFF current is 1.6 μA when the gate voltage is 20V. As the ratio of the ON current to the OFF current is about $10^7$, it can be known that the on/off current characteristic is good.

It turns out from the experimental results that the inventive thin film transistor array substrate bears good electrical characteristic.

As described above, in the inventive thin film transistor array substrate, the target wiring lines are formed with an Ag alloy bearing a low resistance. Such a thin film transistor array substrate can be well adapted for use in a wide-screen high definition display device. Furthermore, the contact resistance between the neighboring lines can be reduced while giving reliability to the resulting display device.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A wiring line assembly for a display device, comprising:
    a wire formed of an Ag alloy,
        wherein the Ag alloy includes Ag and an alloy element bearing a low melting point.

2. The wiring line assembly of claim 1, wherein the alloy element bears a diffusion coefficient of 1.5E-12 $cm^2$/sec or more.

3. The wiring line assembly of claim 1, wherein the alloy element bears a melting point of 1500K or less.

4. The wiring line assembly of claim 1, wherein the composition content of the alloy element is 20at% or less.

5. The wiring line assembly of claim 1, wherein the alloy element is selected from the group consisting of Li, Mg, Al, Sm, and Mn.

6. The wiring line assembly of claim 1, wherein the Ag alloy is used for reflection electrodes for a reflection type liquid crystal display.

7. A thin film transistor array substrate, comprising:
- a gate line assembly made of an Ag alloy, the gate line assembly including a gate electrode and a gate line;
- a data line assembly crossing over the gate line assembly while being insulated from the gate line assembly, the data line assembly including a source electrode, a drain electrode and a data line;
- a semiconductor layer contacting the source electrode and the drain electrode, the semiconductor layer forming a thin film transistor together with the gate electrode, the source electrode and the drain electrode; and
- a pixel electrode connected to the drain electrode,
    wherein the Ag alloy comprises Ag and an alloy element bearing a low melting point.

8. The thin film transistor array substrate of claim 7, wherein the data line assembly is also made of the Ag alloy.

9. The thin film transistor array substrate of claim 7, wherein the alloy element bears a diffusion coefficient of 1.5E-12 $cm^2$/sec or more.

10. The thin film transistor array substrate of claim 7, wherein the alloy element bears a melting point of 1500K or less.

11. The thin film transistor array substrate of claim 7, wherein the composition content of the alloy element is 20at% or less.

12. The thin film transistor array substrate of claim 7, wherein the alloy element is selected from the group consisting of Li, Mg, Al, Sm, and Mn.

13. The thin film transistor array substrate of claim 7, further comprising:
- an insulating substrate under the gate line assembly;
- a gate insulating layer covering the gate line assembly and being under the semiconductor layer; and
- a protective layer covering the data line assembly with a contact hole exposing the drain electrode,
    wherein the drain electrode is placed on the semiconductor layer together with the source electrode and the pixel electrode is connected to the drain electrode through the contact hole.

14. The thin film transistor array substrate of claim 13, wherein the semiconductor layer is formed of hydrogenated amorphous silicon.

15. The thin film transistor array substrate of claim 13, further comprising an oxide layer formed on the gate line assembly.

16. The thin film transistor array substrate of claim 13, further comprising an alloy element-oxide layer interposed between the source electrode and the semiconductor layer and between the drain electrode and the semiconductor layer.

17. The thin film transistor array substrate of claim 7, further comprising:
- an insulating substrate under the semiconductor layer, the semiconductor layer comprising a source region, a drain region and a channel region;
- a gate insulating layer covering the semiconductor layer and being under the gate line assembly;
- an inter-layer insulating layer covering the gate line assembly, the inter-layer insulating layer and the gate insulating layer having contact holes exposing the source region and the drain region, the source electrode and the drain electrode being respectively connected to the source region and the drain region through the contact holes; and
- a protective layer covering the data line assembly with a contact hole exposing the drain electrode, the pixel electrode being connected to the drain electrode through the contact hole of the protective layer.

18. The thin film transistor array substrate of claim 17, wherein the semiconductor layer is formed of polycrystalline silicon.

19. The thin film transistor array substrate of claim 17, further comprising an alloy element-oxide layer interposed between the source electrode and the semiconductor layer and between the drain electrode and the semiconductor layer.

* * * * *